United States Patent
Sima et al.

(10) Patent No.: US 7,570,079 B2
(45) Date of Patent: Aug. 4, 2009

(54) LEVEL-RESTORING BUFFERS FOR PROGRAMMABLE INTERCONNECT CIRCUITS AND METHOD FOR BUILDING THE SAME

(76) Inventors: Mihai Sima, 201-3259 Alder Street, Victoria, British Columbia (CA) V8X 1P3; Scott Alexander Miller, 3250 Orillia Street, Victoria, British Columbia (CA) V8Z 3W9; Michael Liam McGuire, 308-1550 Church Avenue, Victoria, British Columbia (CA) V8P 2H1

( * ) Notice: Subject to any disclaimer, the term of this patent is extended or adjusted under 35 U.S.C. 154(b) by 0 days.

(21) Appl. No.: 12/099,140

(22) Filed: Apr. 7, 2008

(65) Prior Publication Data
US 2008/0265937 A1 Oct. 30, 2008

Related U.S. Application Data

(60) Provisional application No. 60/912,317, filed on Apr. 17, 2007.

(51) Int. Cl.
*H01L 25/00* (2006.01)
*H03K 19/177* (2006.01)
(52) U.S. Cl. .............................. 326/41; 326/47; 326/113
(58) Field of Classification Search ..................... None
See application file for complete search history.

(56) References Cited

U.S. PATENT DOCUMENTS 7,420,389 B2 * 9/2008 Schmit et al. ................. 326/38
2006/0132176 A1 * 6/2006 Lewis .......................... 326/44

* cited by examiner

*Primary Examiner*—Anh Q Tran

(57) ABSTRACT

A technique that unfolds the nMOS-tree multiplexer to improve the propagation delay and/or active power consumption is provided. The main idea is to replicate the nMOS element of the downstream buffer, where each replica is driven by a signal that originates from earlier stages of the nMOS-tree multiplexer. This way, when passing high logic values, signals from earlier stages directly drive the downstream buffer improving the delay or the slope of the transition edge (with beneficial effects for power consumption). The passing of low logic values is still performed in the original way by the nMOS tree and the pMOS element of the downstream buffer.

12 Claims, 25 Drawing Sheets

Improved programmable interconnect structure with a two-stage multiplexer with connections from input nodes, an inverting buffer, a keeper, and a bleeder (SEL stands for Selection; MC stands for Memory Cell).

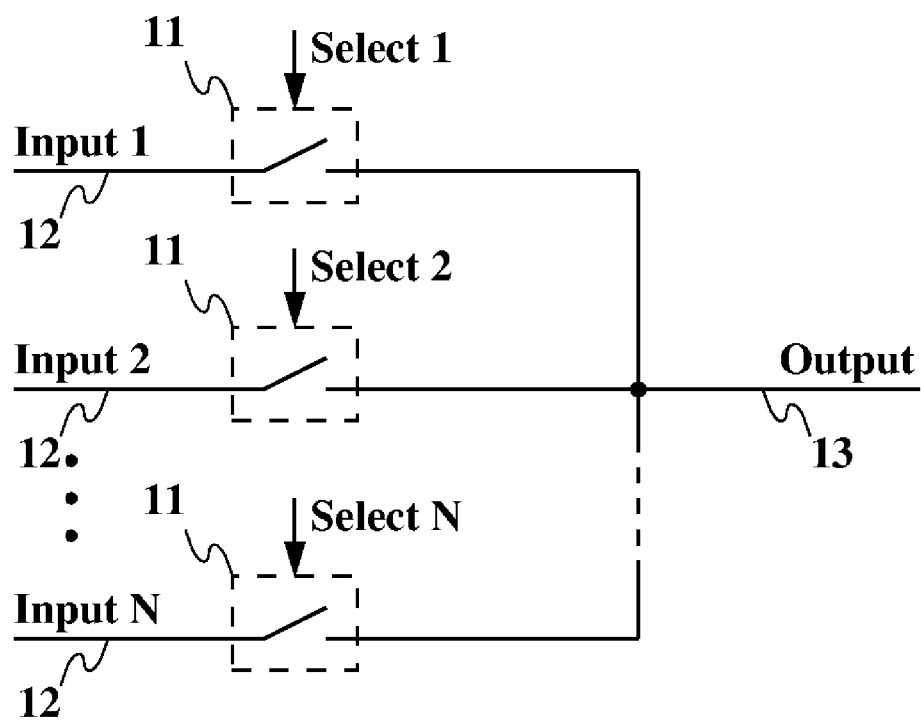
Fig. 1: Programmable interconnect structure with ideal switches.

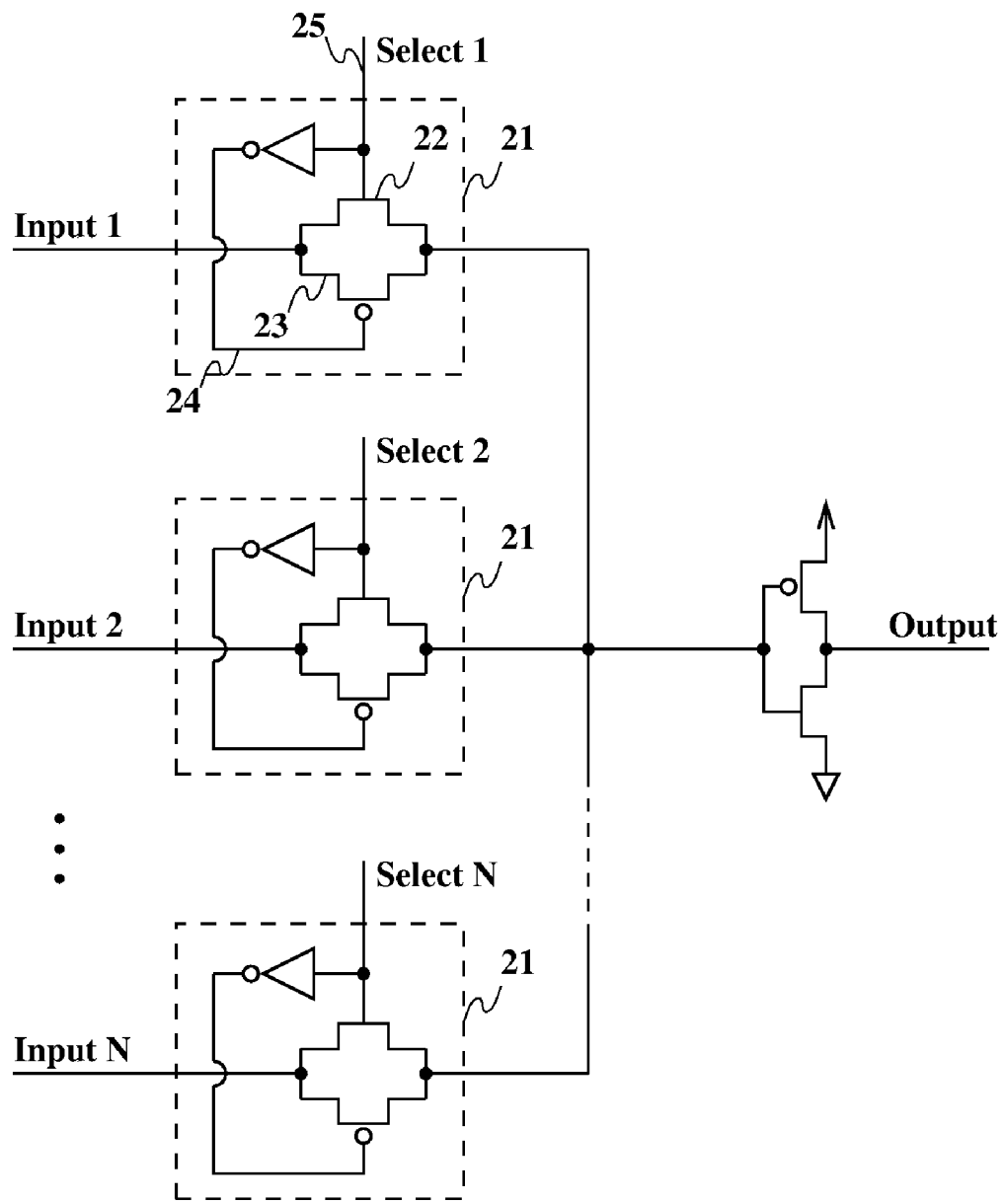
Fig. 2: Prior art: programmable interconnect structure with full transmission gates.

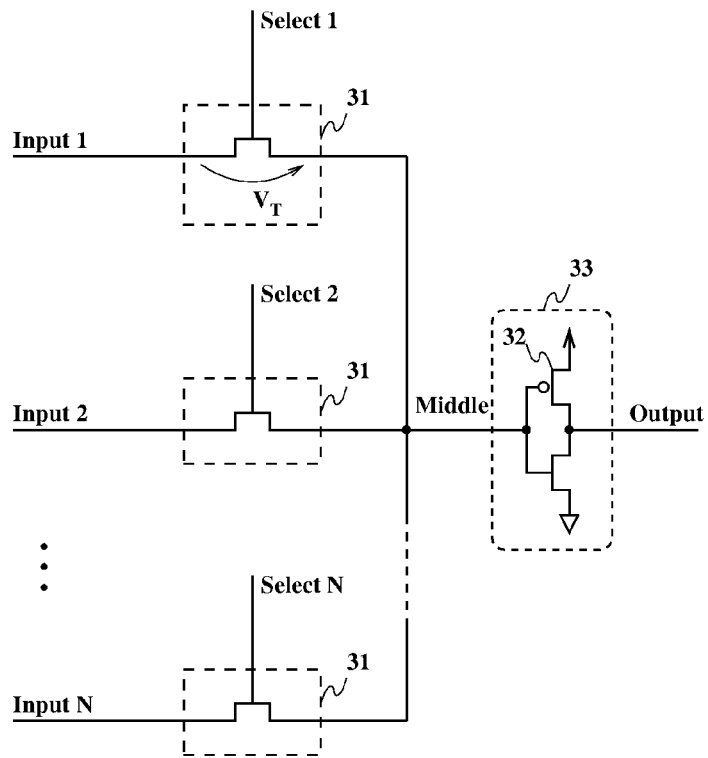
(a) Prior art: programmable interconnect structure with nMOS pass transistors.
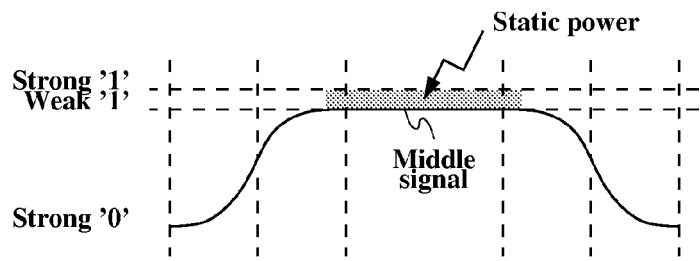
(b) Signal and static power degradation
Fig. 3: Prior art: static power consumption degradation of a programmable interconnect structure with nMOS pass transistors.

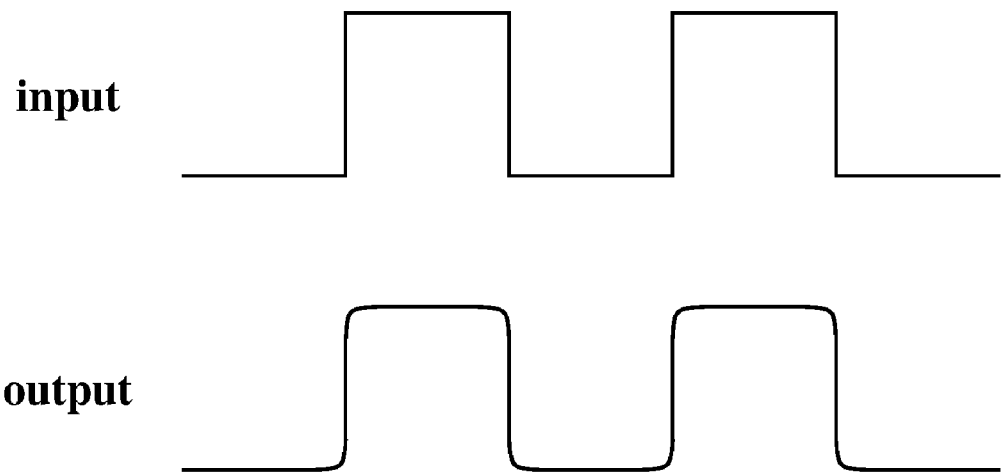
Fig. 4: Perfect timing.
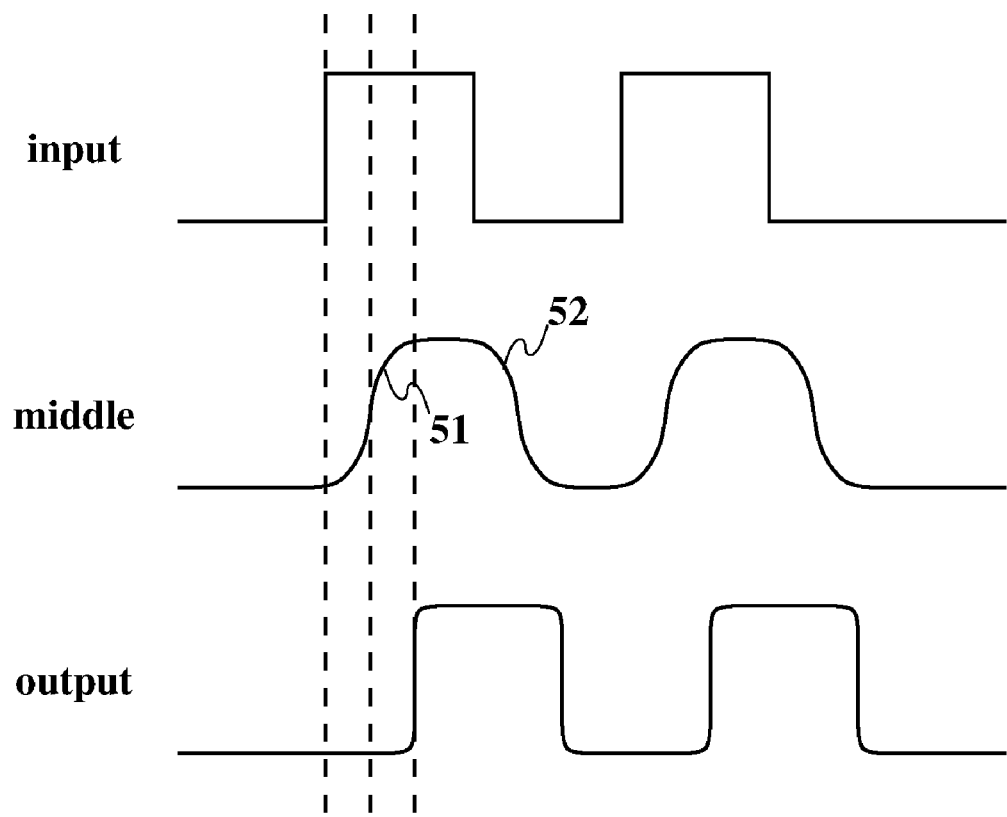
Fig. 5: Real timing.

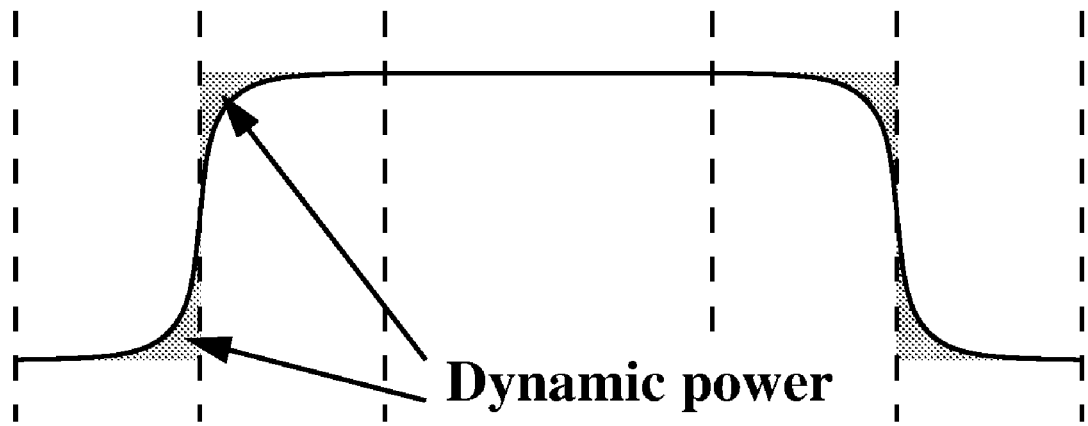
Fig. 6: Large-slope edge leading to a small dynamic power consumption.
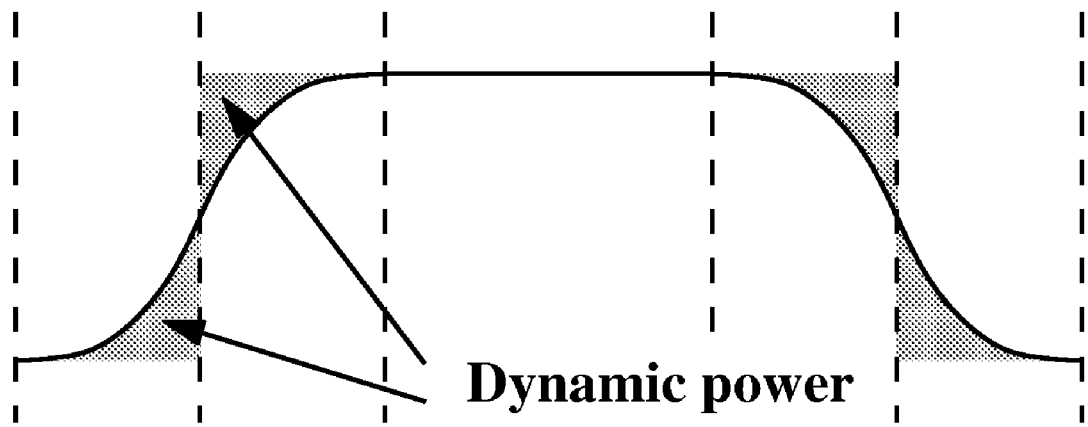
Fig. 7: Small-slope edge leading to a large dynamic power consumption.

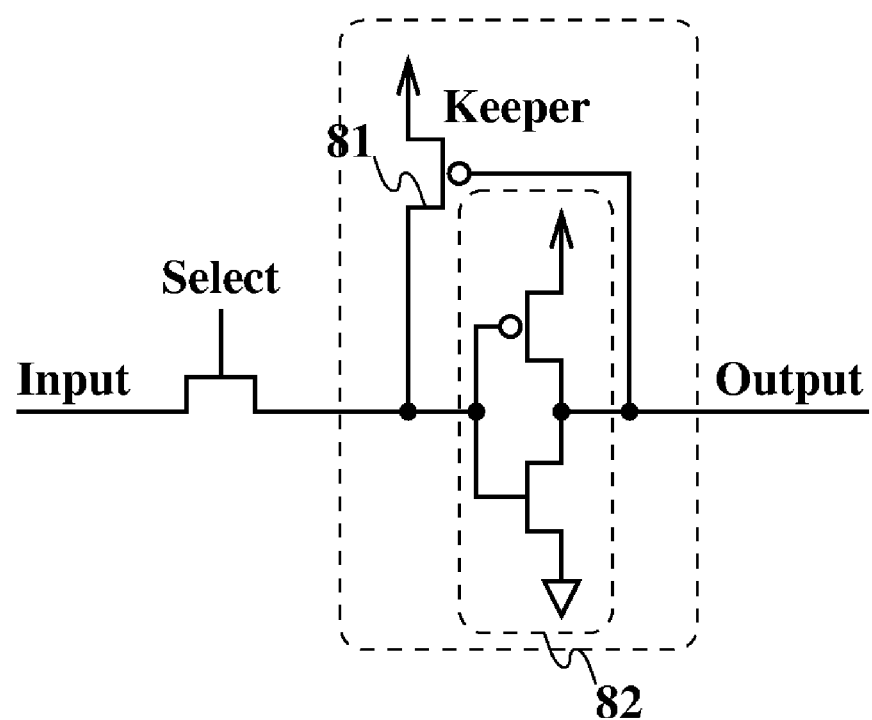
Fig. 8: Prior art: the standard level-restoring buffer with keeper only.

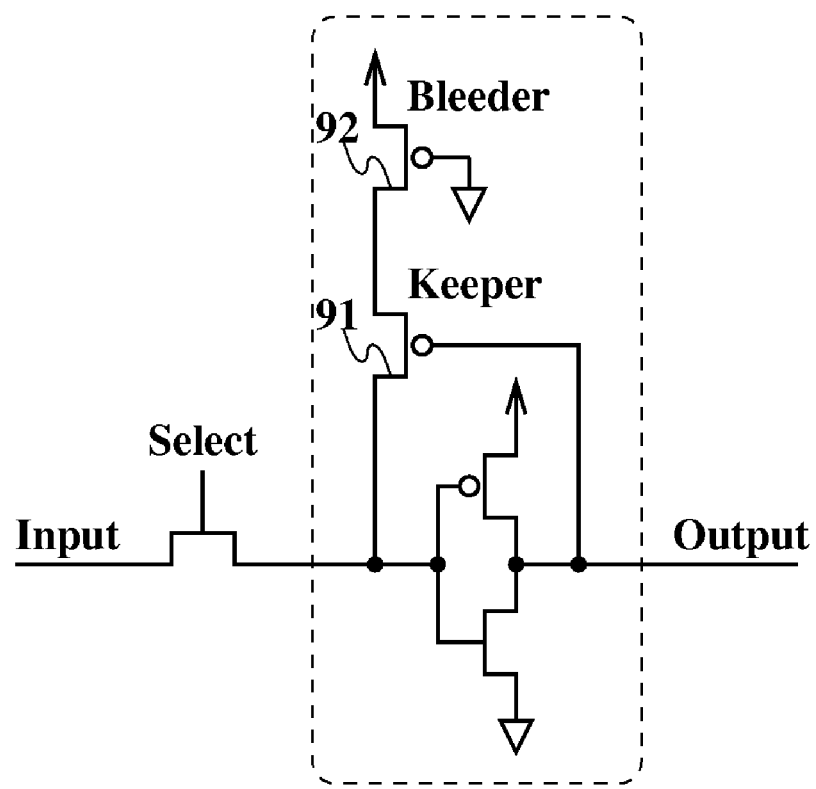
Fig. 9: Prior art: the standard level-restoring buffer with keeper and bleeder.

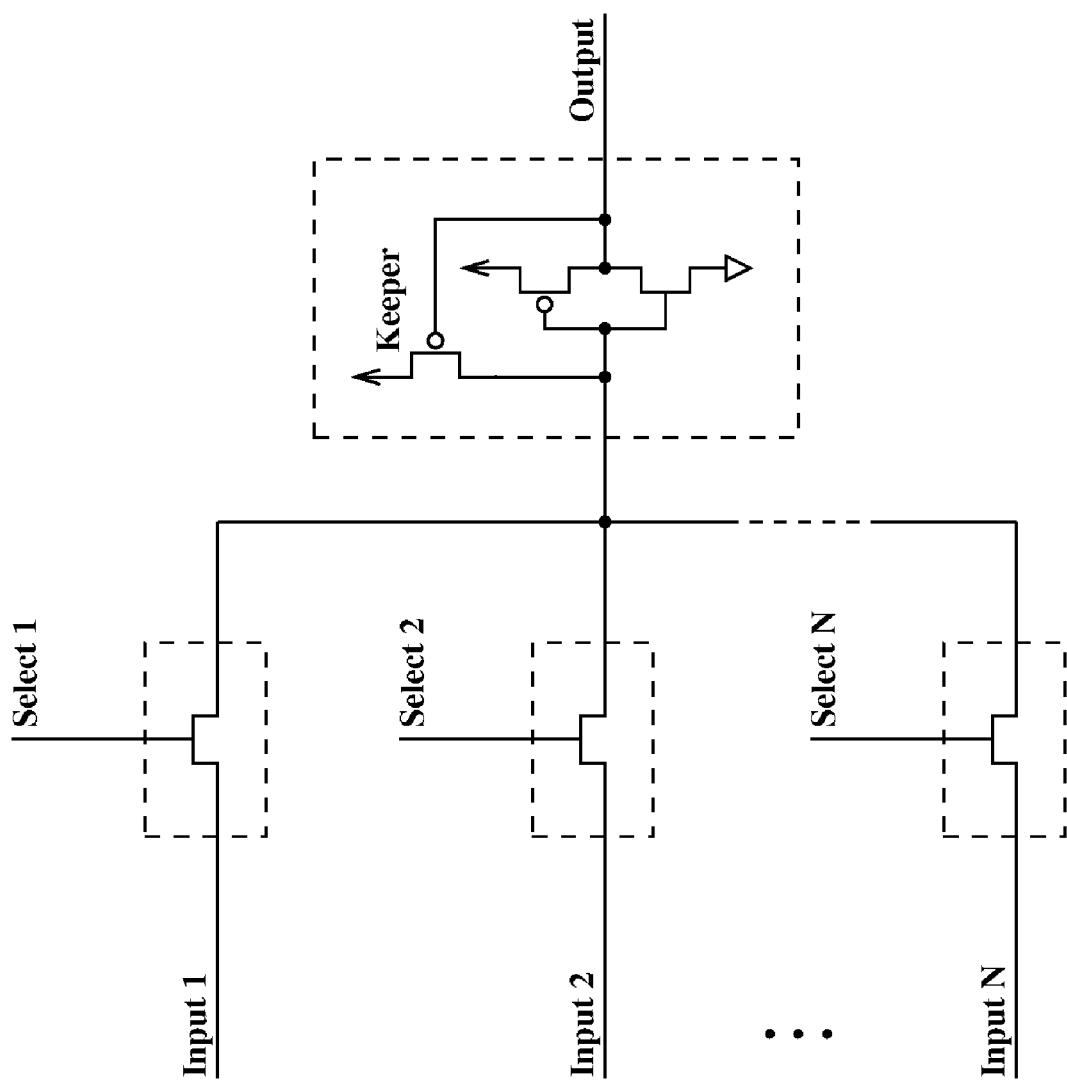
Fig. 10: Prior art: nMOS based MUX with standard level-restoring buffer with keeper only.

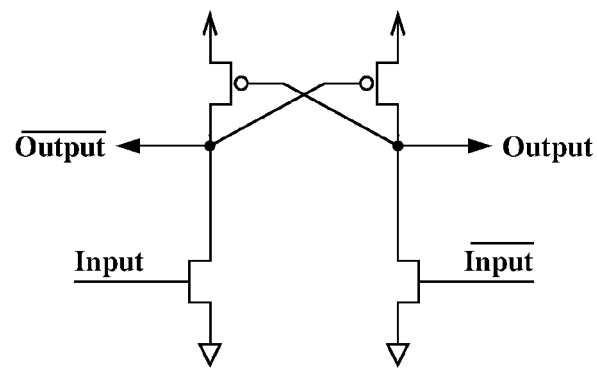
Fig. 11: Prior art: level-restoring buffer based on cascode voltage switch logic family.
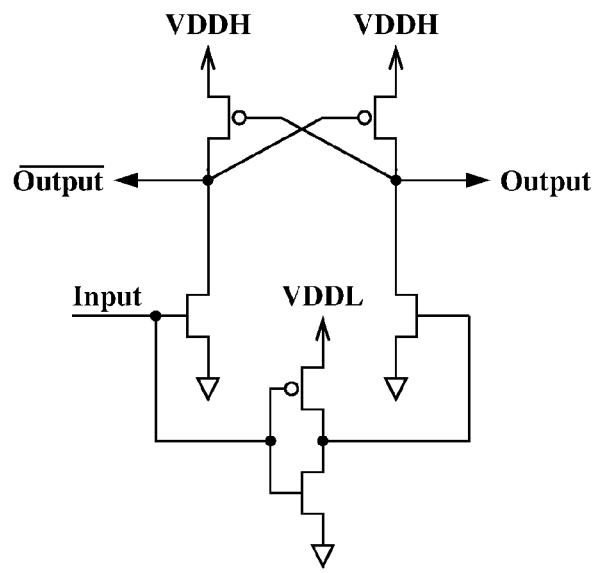
Fig. 12: Prior art: level-restoring buffer based on cascode voltage switch logic family with low-voltage inverter (VDDH stands for a high voltage supply, VDDL stands for a low voltage supply).

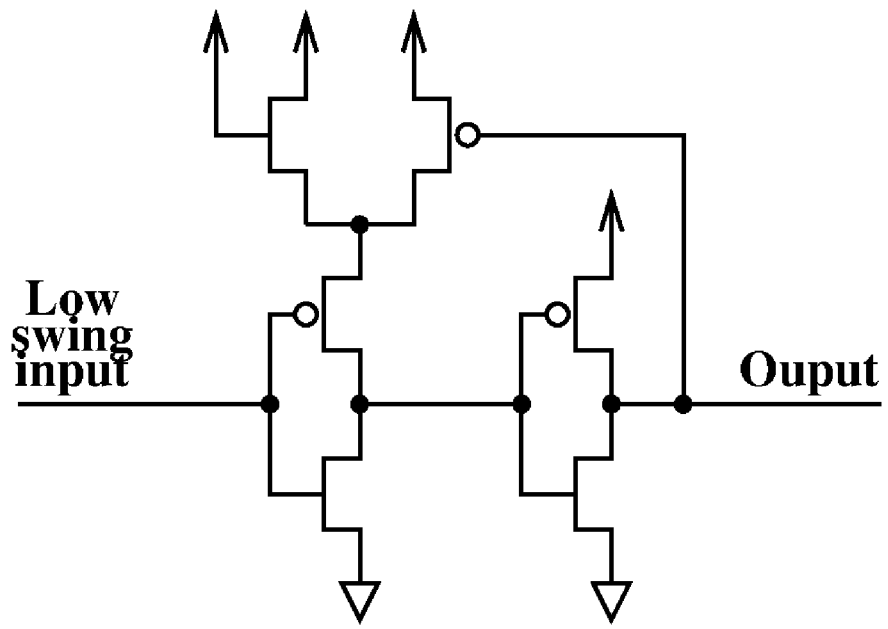
Fig. 13: Prior art: level-restoring buffer proposed by Puri et al.
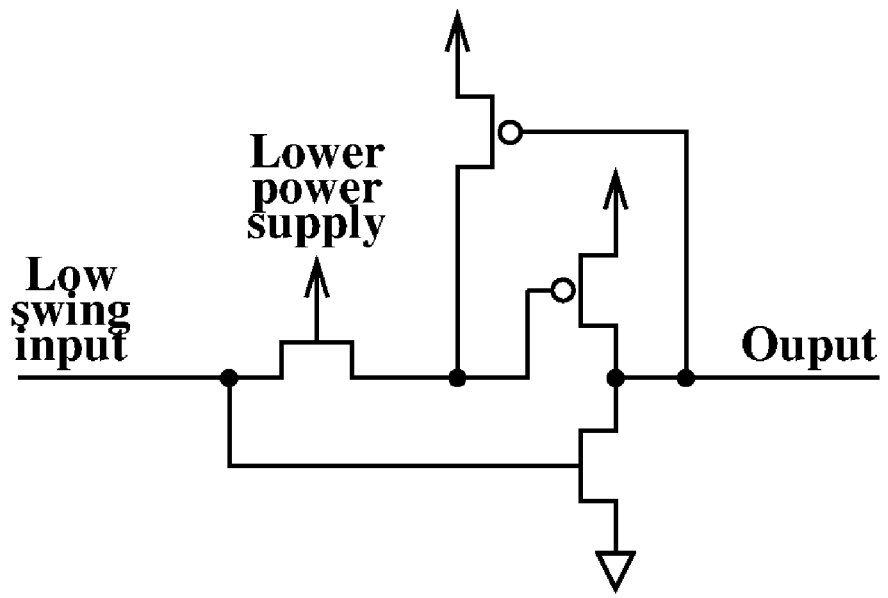
Fig. 14: Prior art: "pass transistor half-latch" level-restoring buffer.

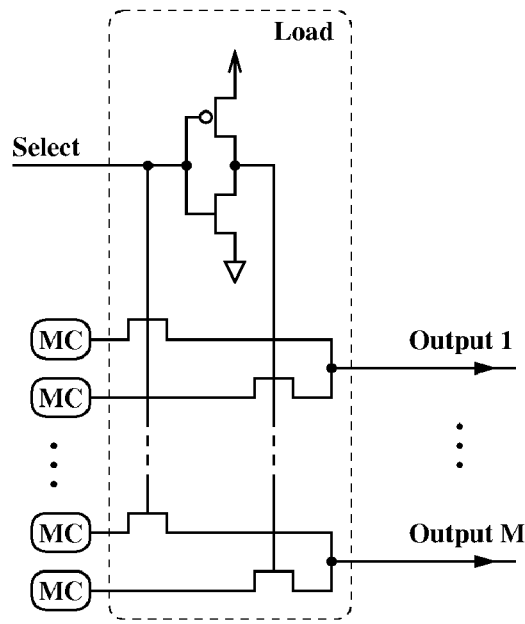
Fig. 15: Prior art: one stage of an FPGA Look-Up Table (MC stands for Memory Cell).
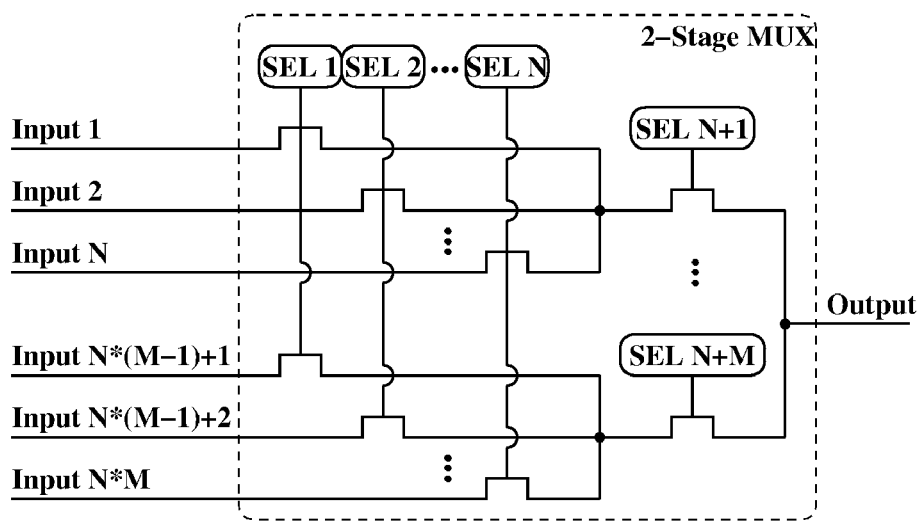
Fig. 16: Prior art: FPGA two-stage multiplexer (SEL stands for Selection).

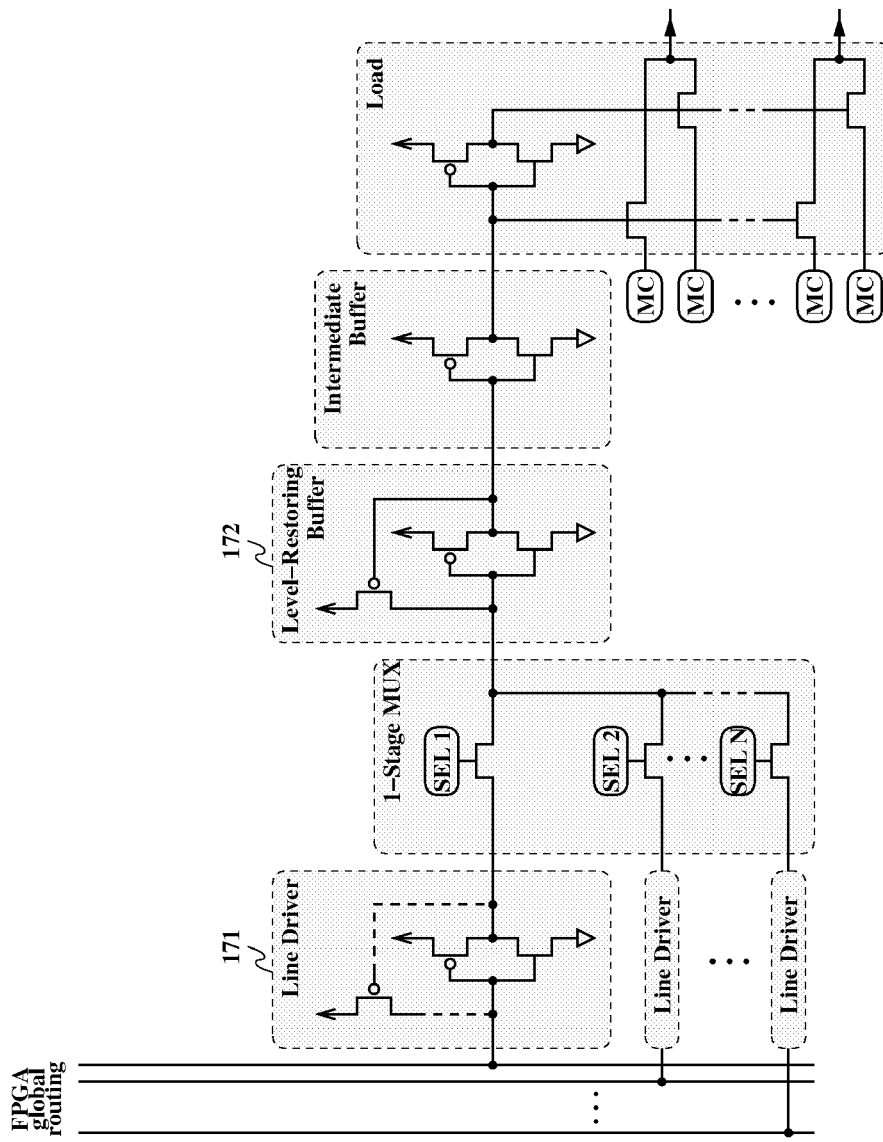
Fig. 17: Prior art: programmable interconnect structure including a Line Driver, one-stage Multiplexer, a Level-Restoring Buffer (with or without a Bleeder), and a Look-Up Table as Load (SEL stands for Selection; MC stands for Memory Cell).

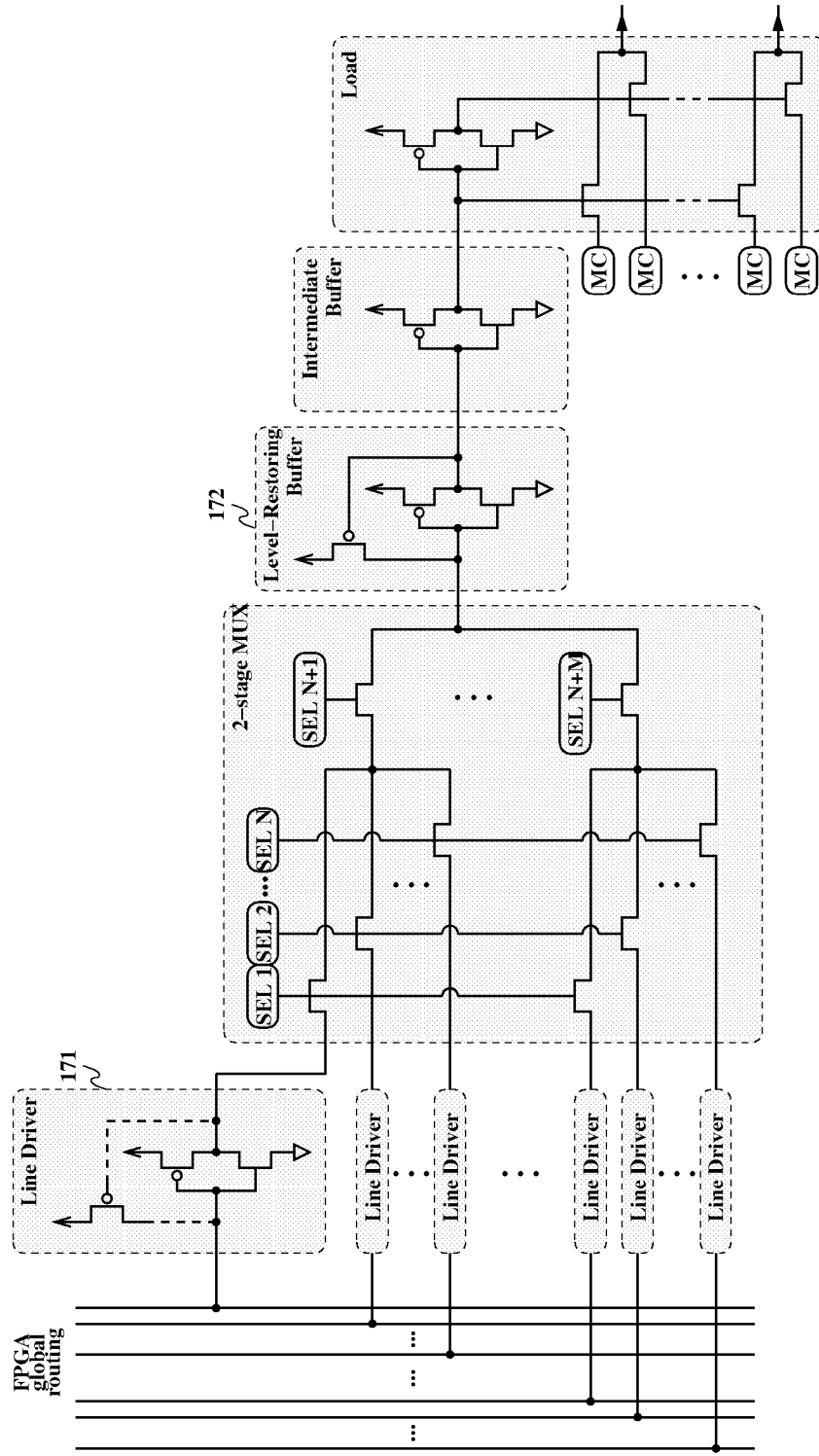
Fig. 18: Prior art: programmable interconnect structure including a Line Driver, a two-stage Multiplexer, a Level-Restoring Buffer (with or without a Bleeder), and a Look-Up Table as Load (SEL stands for Selection; MC stands for Memory Cell).

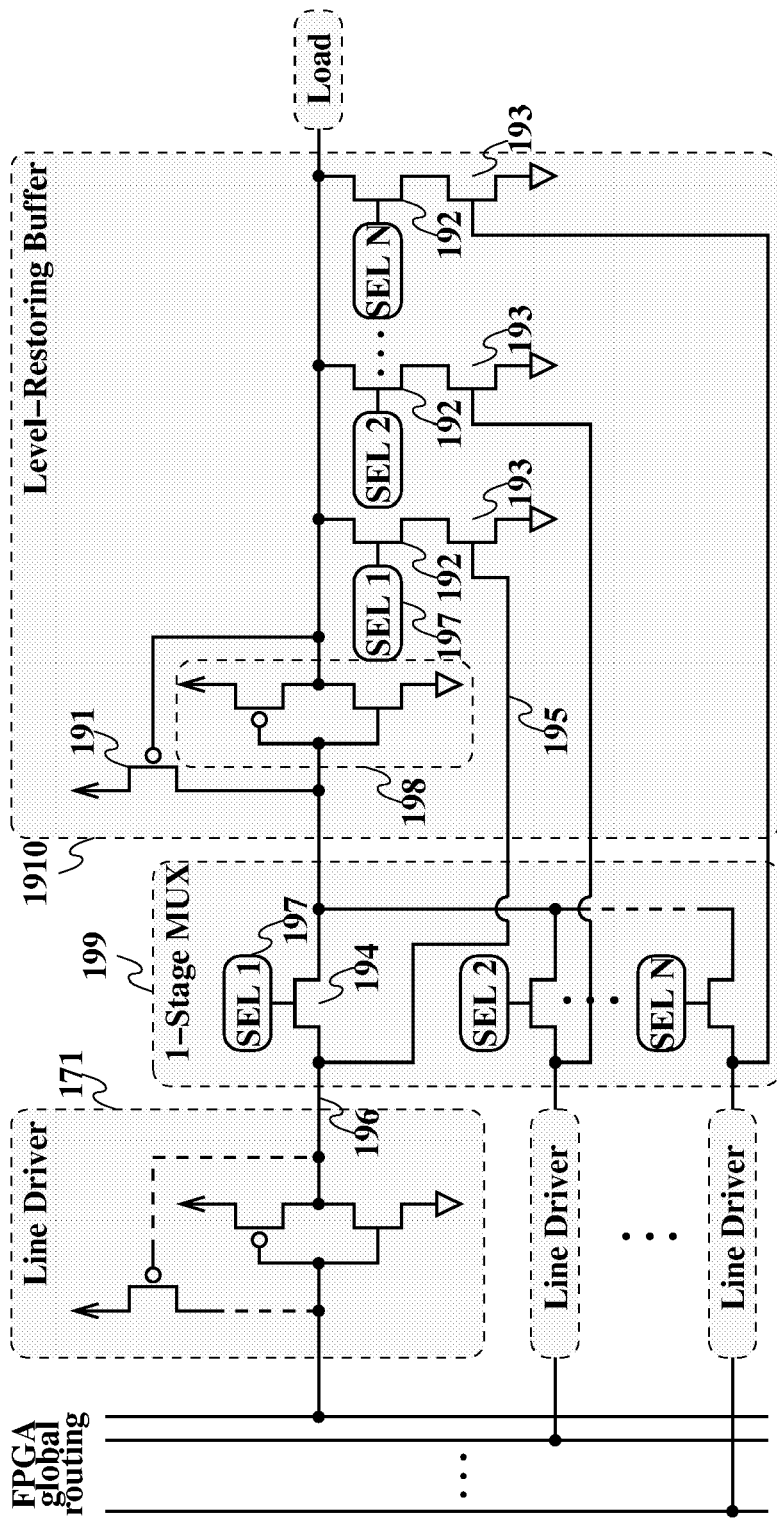
Fig. 19: Improved programmable interconnect structure with a one-stage multiplexer, an inverting buffer, and a keeper (SEL stands for Selection; MC stands for Memory Cell).

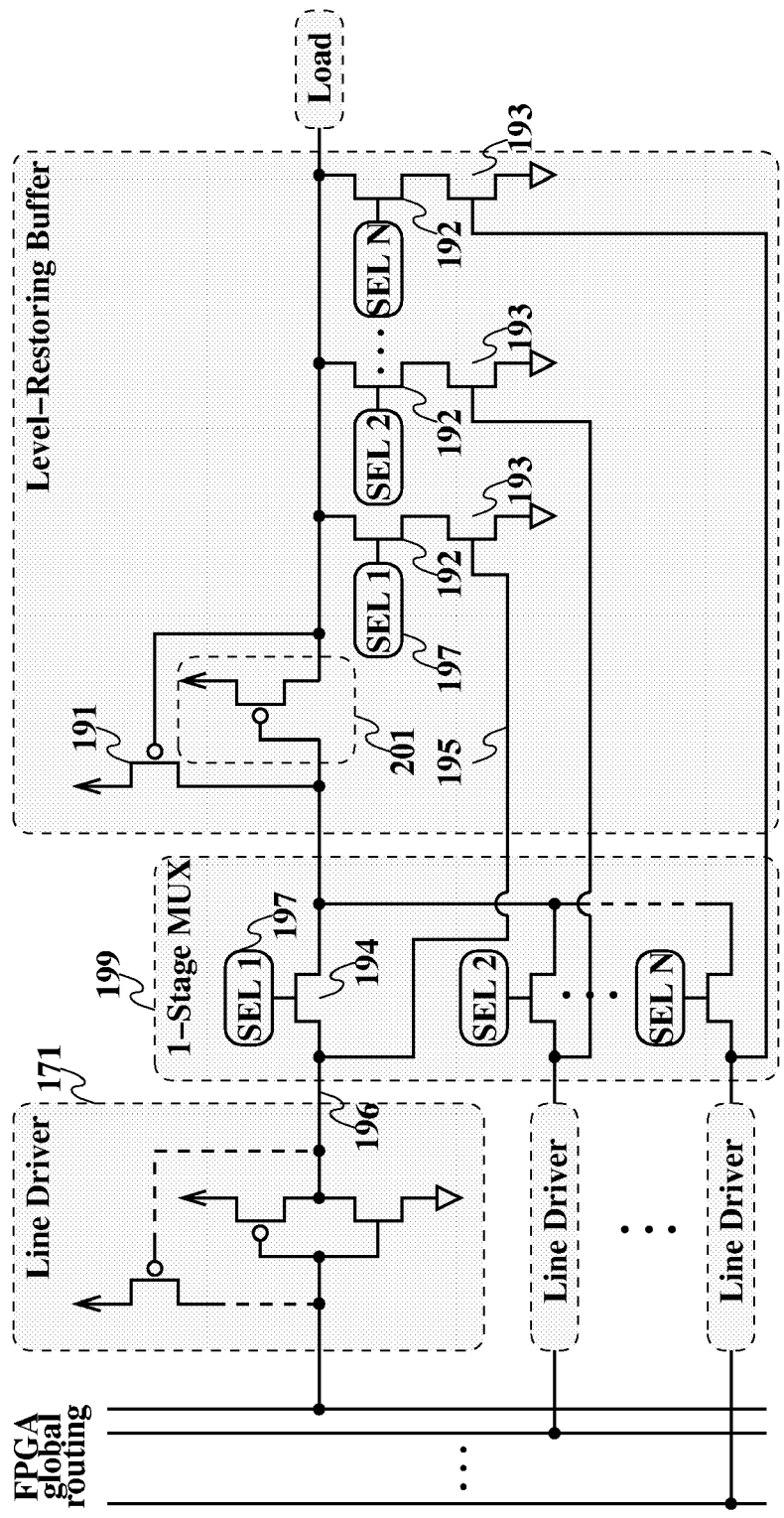
Fig. 20: Improved programmable interconnect structure with a one-stage multiplexer, an inverting pMOS transistor, and a keeper (SEL stands for Selection; MC stands for Memory Cell).

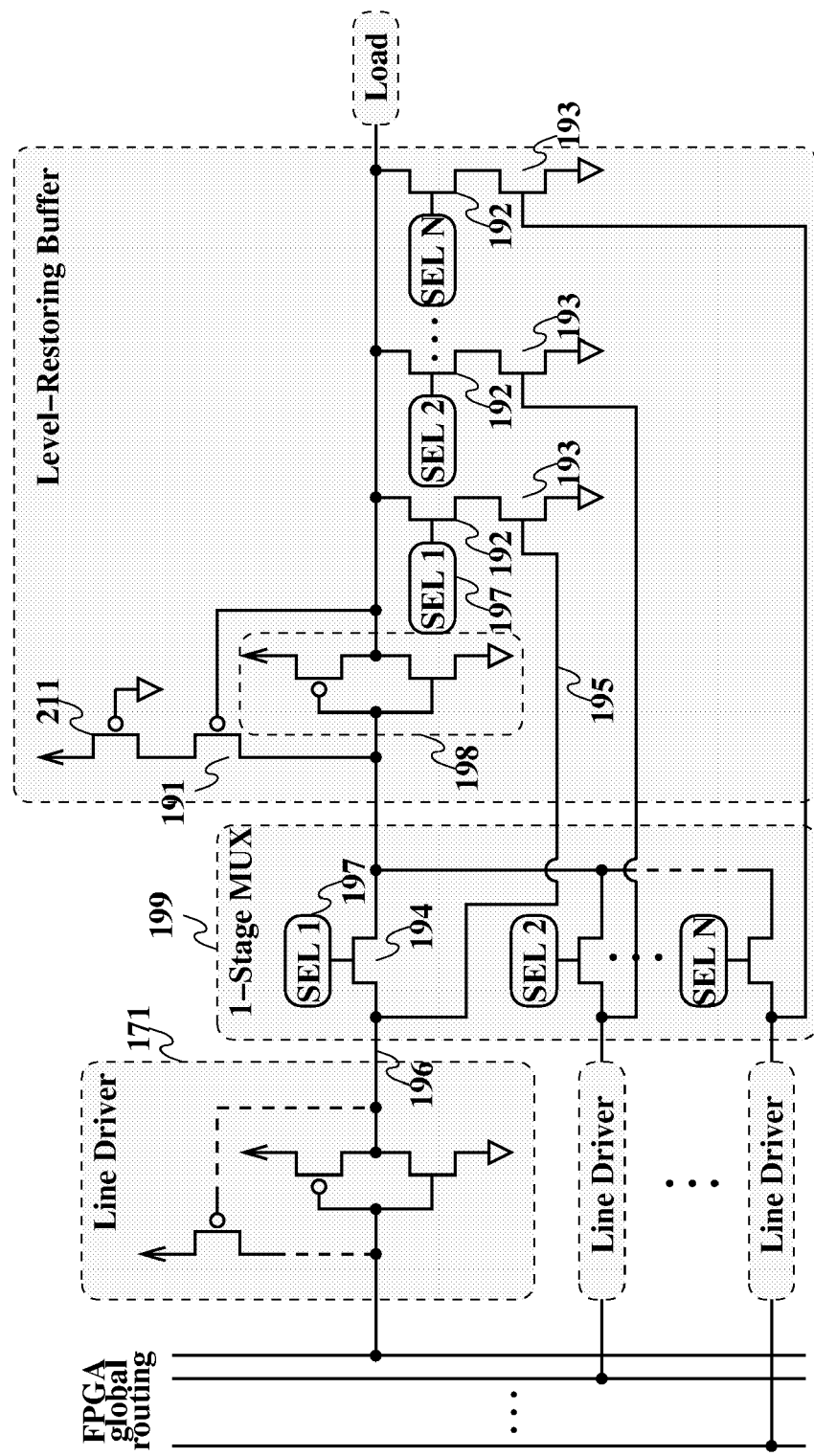
Fig. 21: Improved programmable interconnect structure with a one-stage multiplexer, an inverting buffer, a keeper, and a bleeder (SEL stands for Selection; MC stands for Memory Cell).

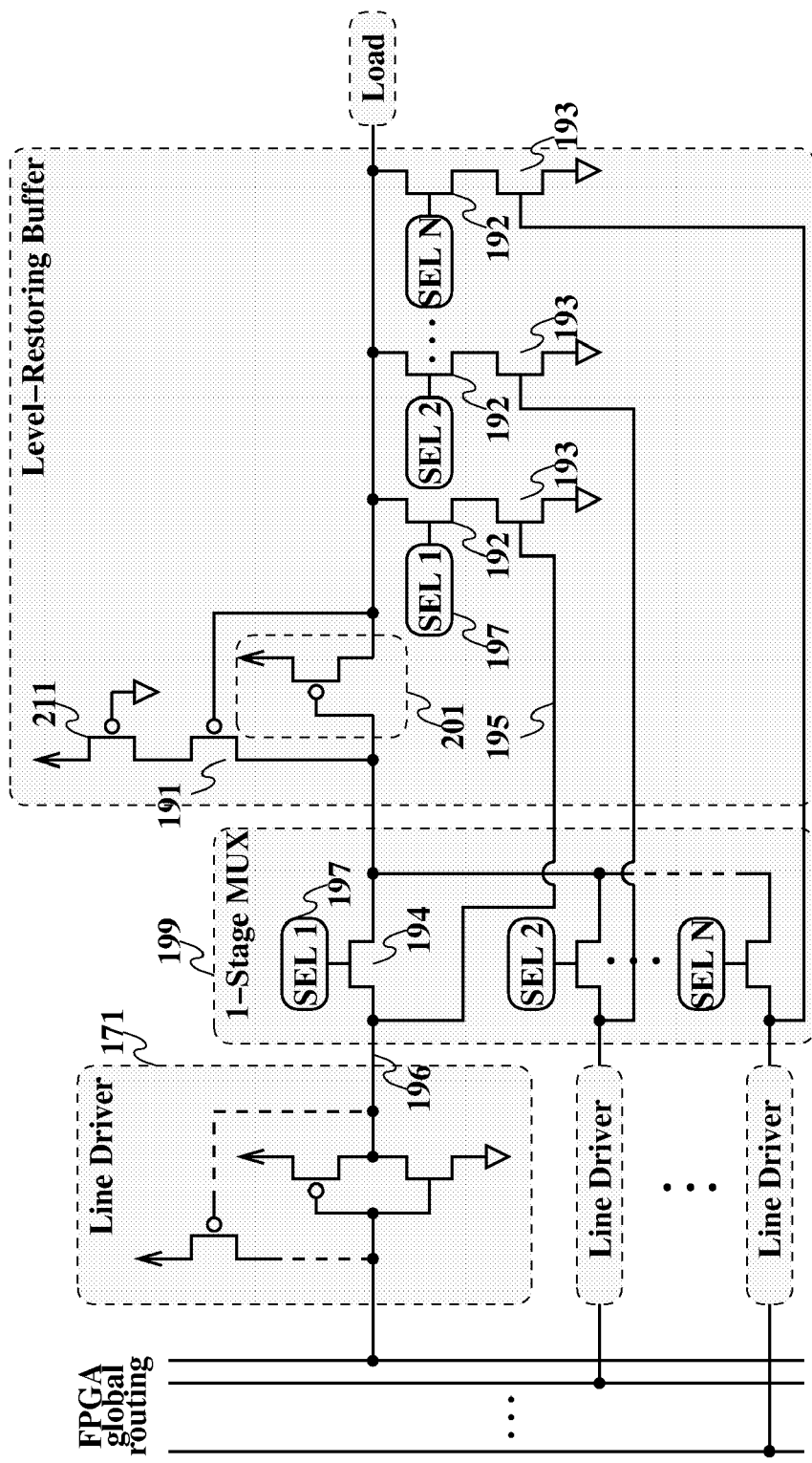
Fig. 22: Improved programmable interconnect structure with a one-stage multiplexer, an inverting pMOS transistor, a keeper, and a bleeder (SEL stands for Selection; MC stands for Memory Cell).

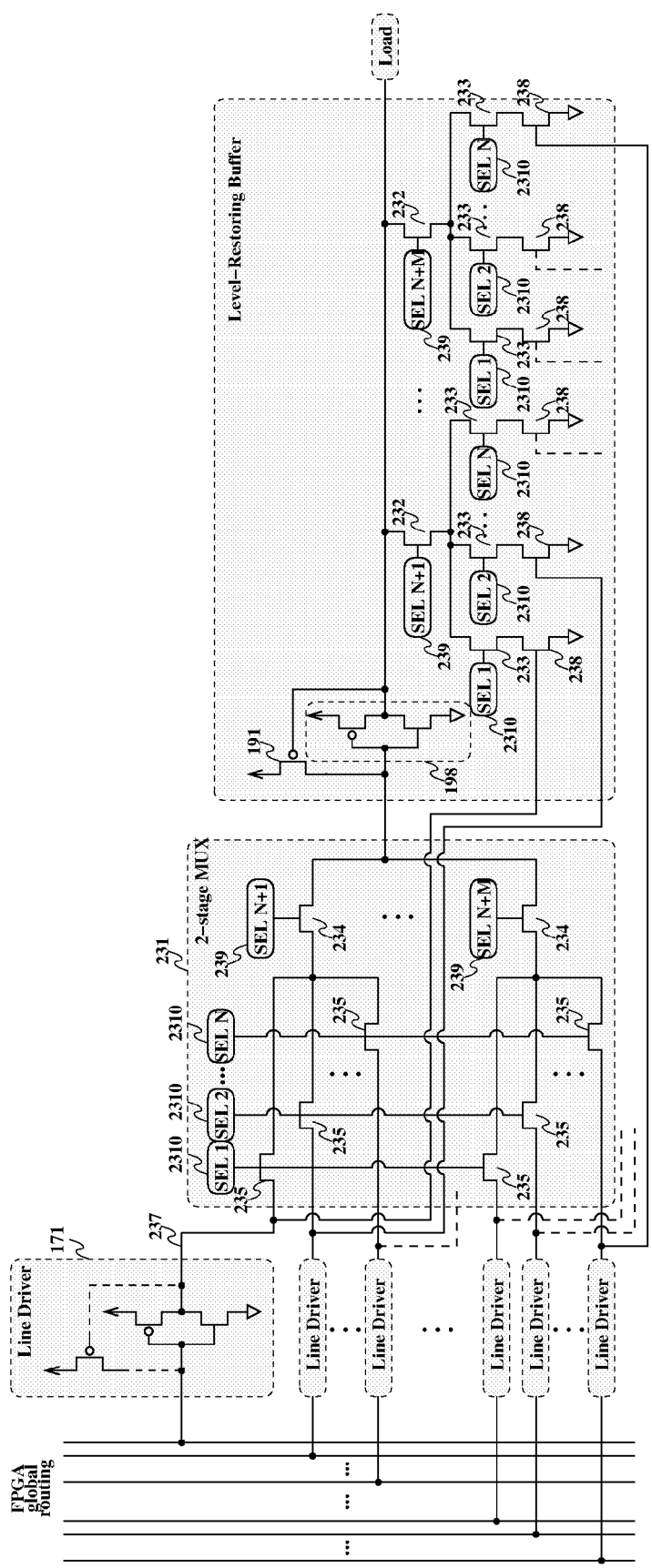
Fig. 23: Improved programmable interconnect structure with a two-stage multiplexer with connections from input nodes, an inverting buffer, and a keeper (SEL stands for Selection; MC stands for Memory Cell).

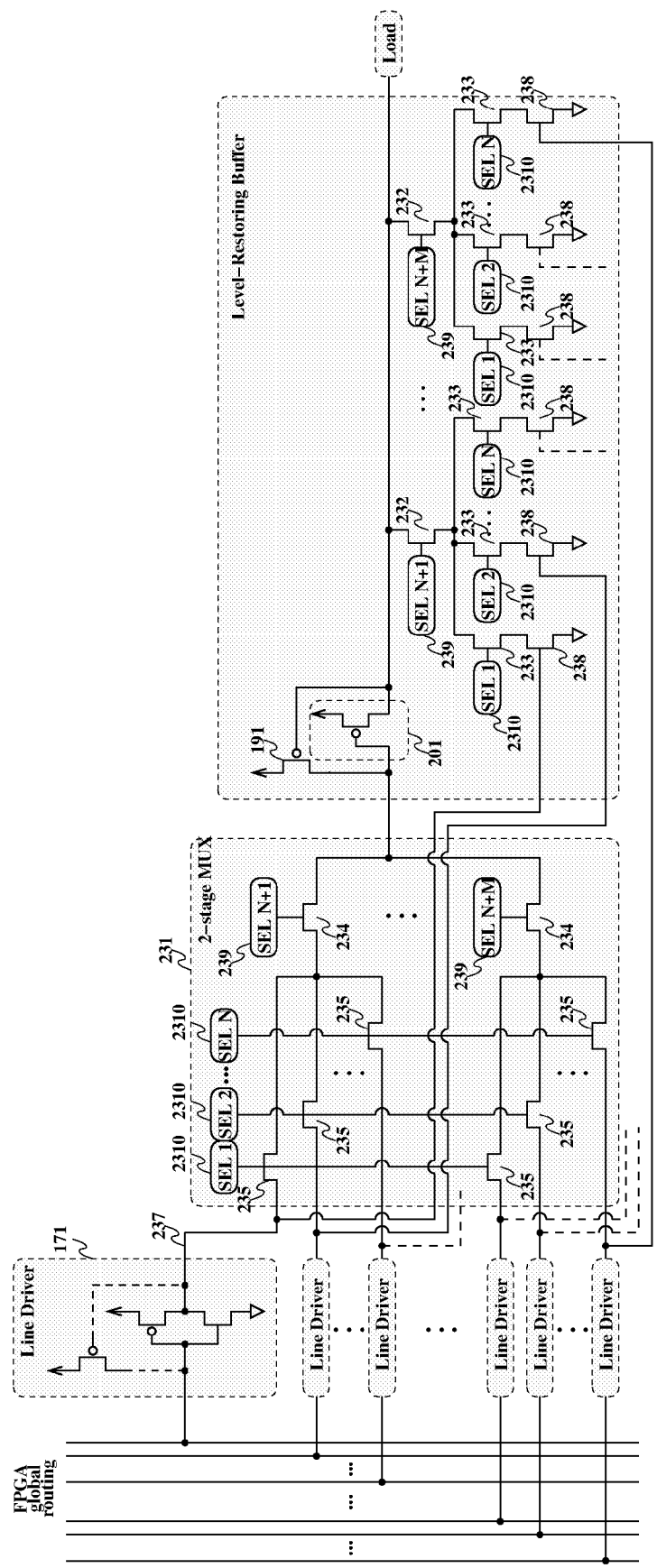
Fig. 24: Improved programmable interconnect structure with a two-stage multiplexer with connections from input nodes, an inverting pMOS transistor, and a keeper (SEL stands for Selection; MC stands for Memory Cell).

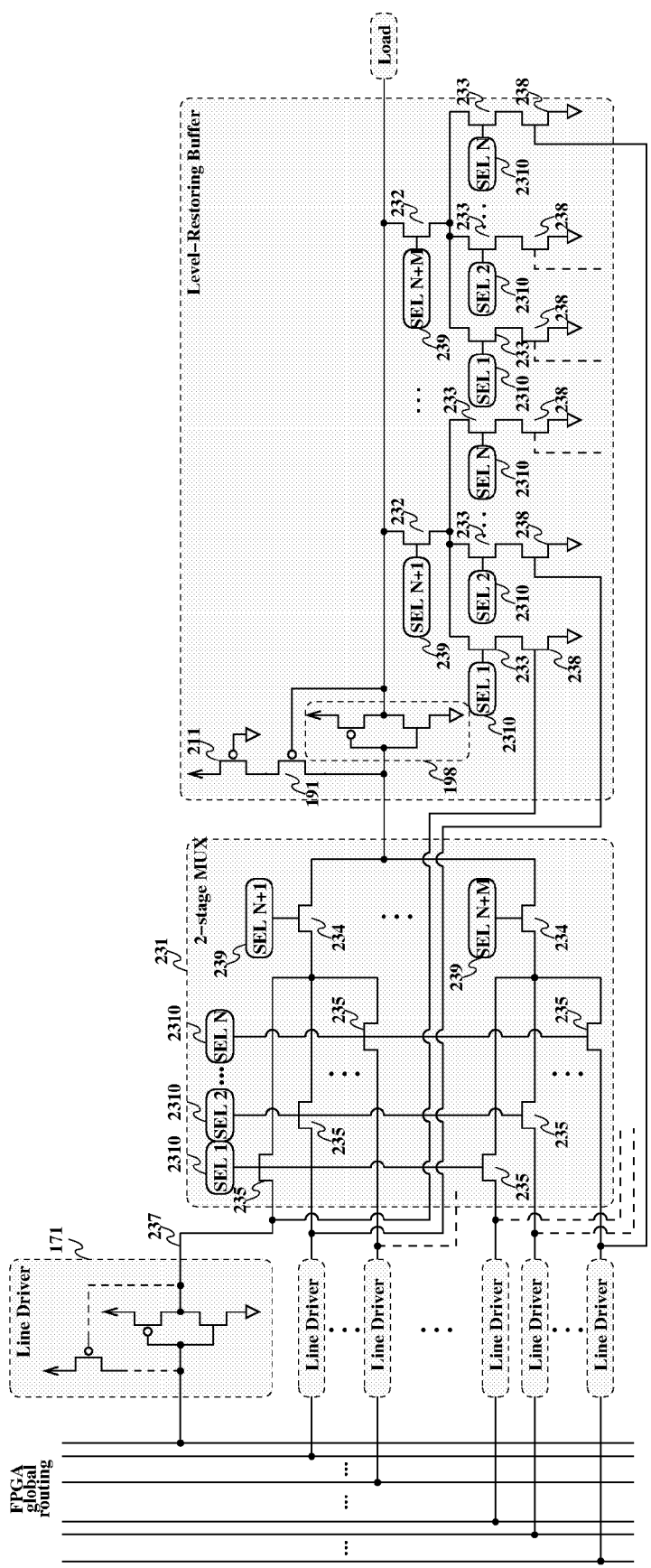
Fig. 25: Improved programmable interconnect structure with a two-stage multiplexer with connections from input nodes, an inverting buffer, a keeper, and a bleeder (SEL stands for Selection; MC stands for Memory Cell).

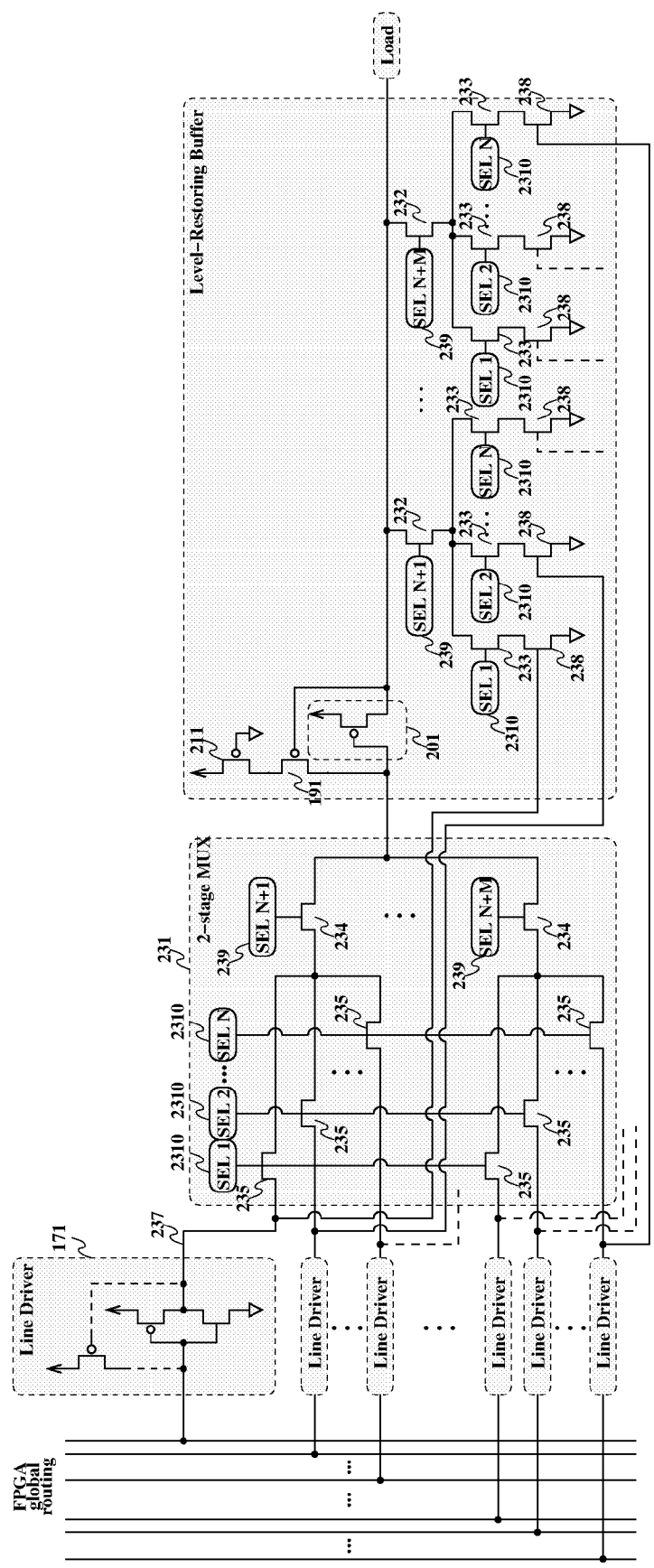
Fig. 26: Improved programmable interconnect structure with a two-stage multiplexer with connections from input nodes, an inverting pMOS transistor, a keeper, and a bleeder (SEL stands for Selection; MC stands for Memory Cell).

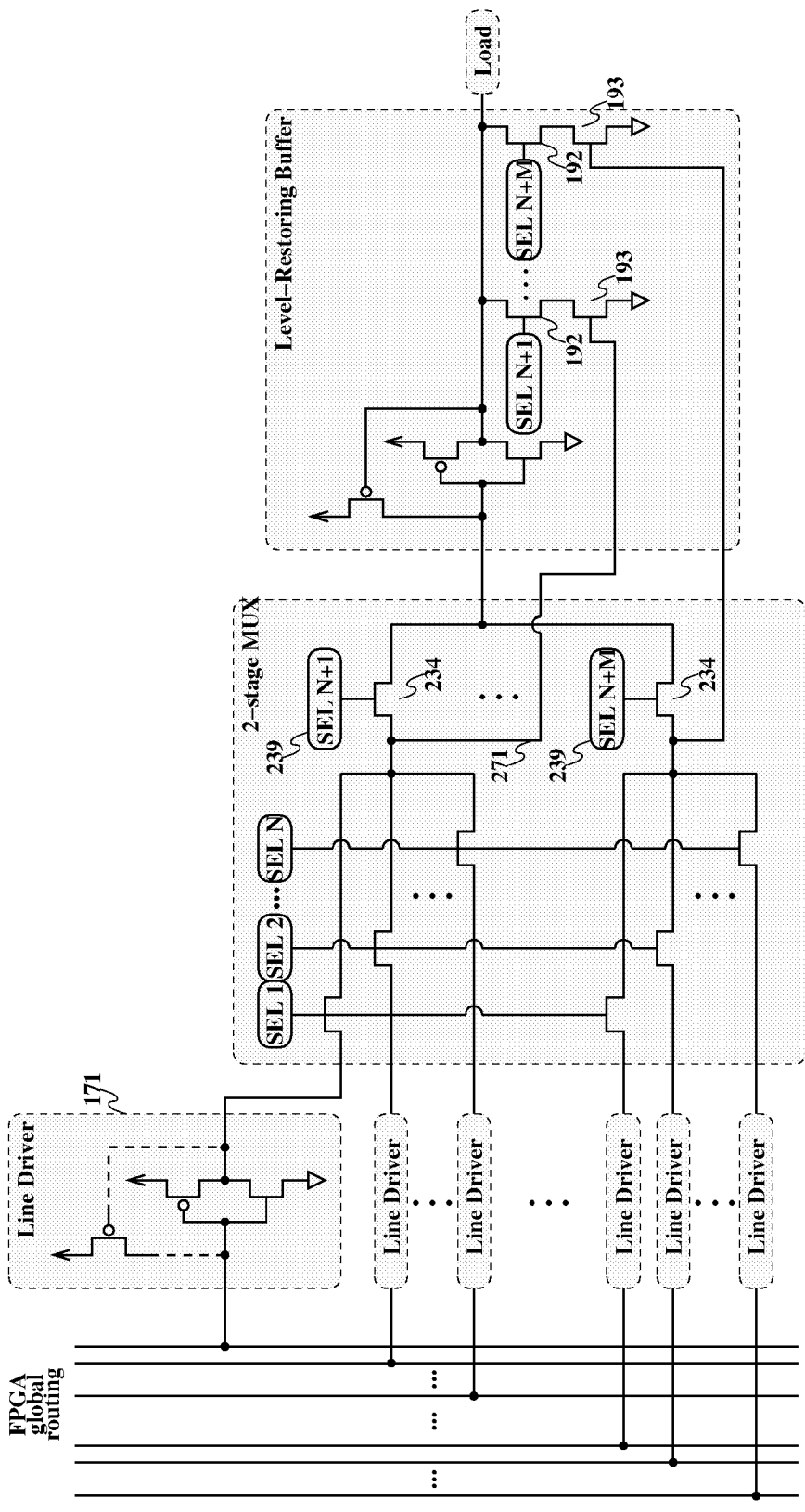
Fig. 27: Improved programmable interconnect structure with a two-stage multiplexer with connections from middle nodes, an inverting buffer, and a keeper (SEL stands for Selection; MC stands for Memory Cell).

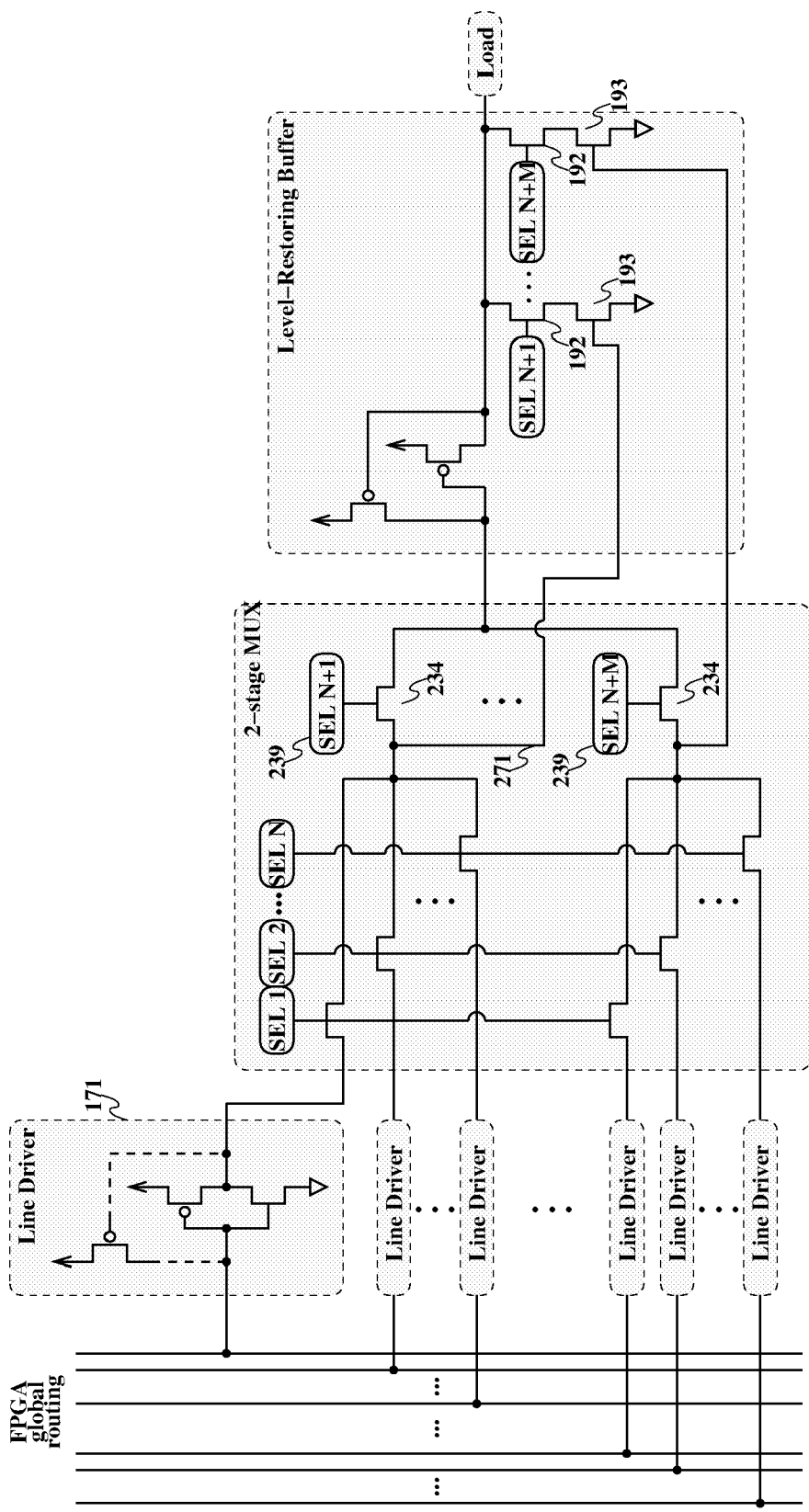
Fig. 28: Improved programmable interconnect structure with a two-stage multiplexer with connections from middle nodes, an inverting pMOS transistor, and a keeper (SEL stands for Selection; MC stands for Memory Cell).

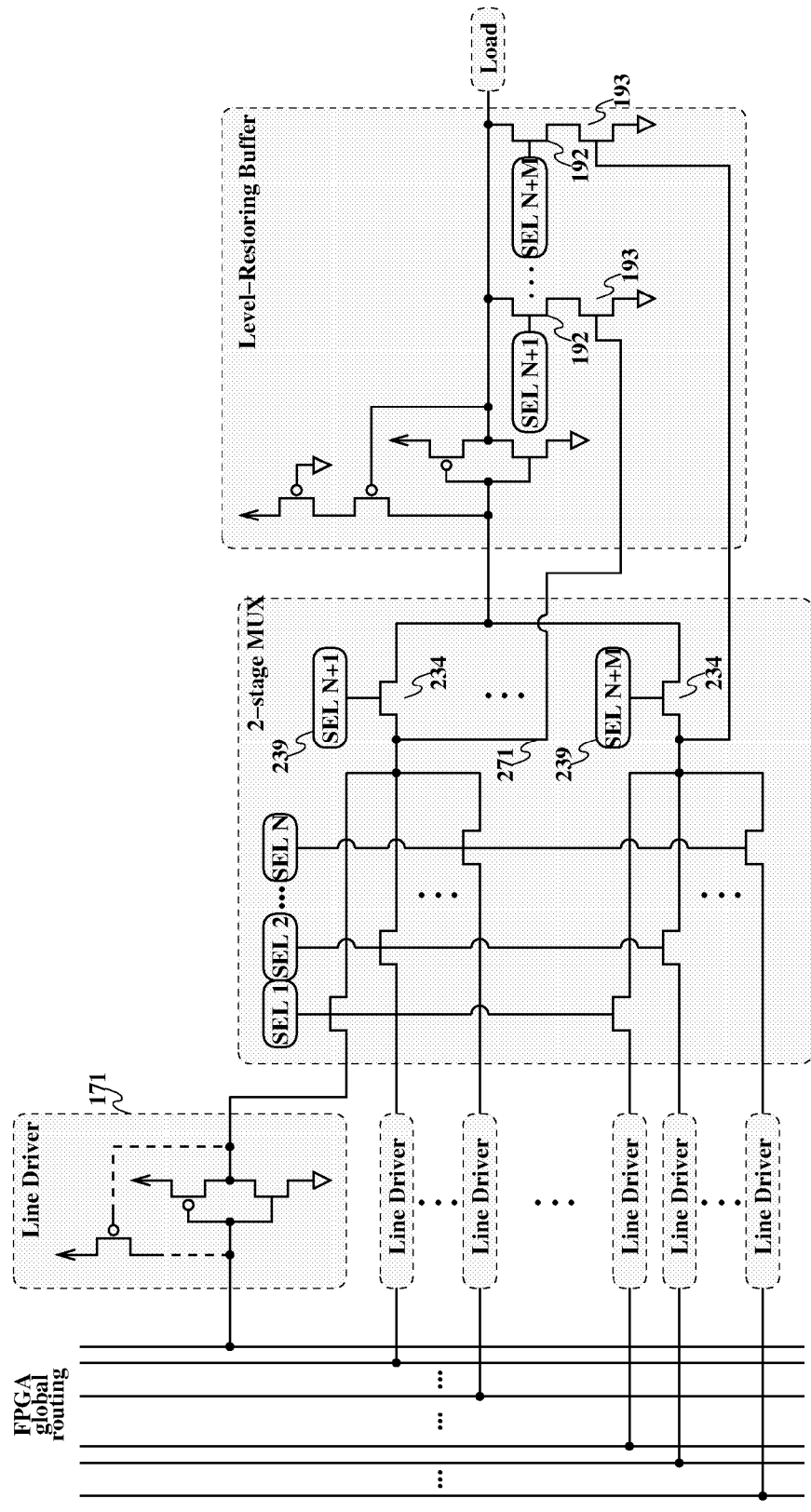
Fig. 29: Improved programmable interconnect structure with an unfolded two-stage multiplexer with connections from middle nodes, an inverting buffer, a keeper, and a bleeder (SEL stands for Selection; MC stands for Memory Cell).

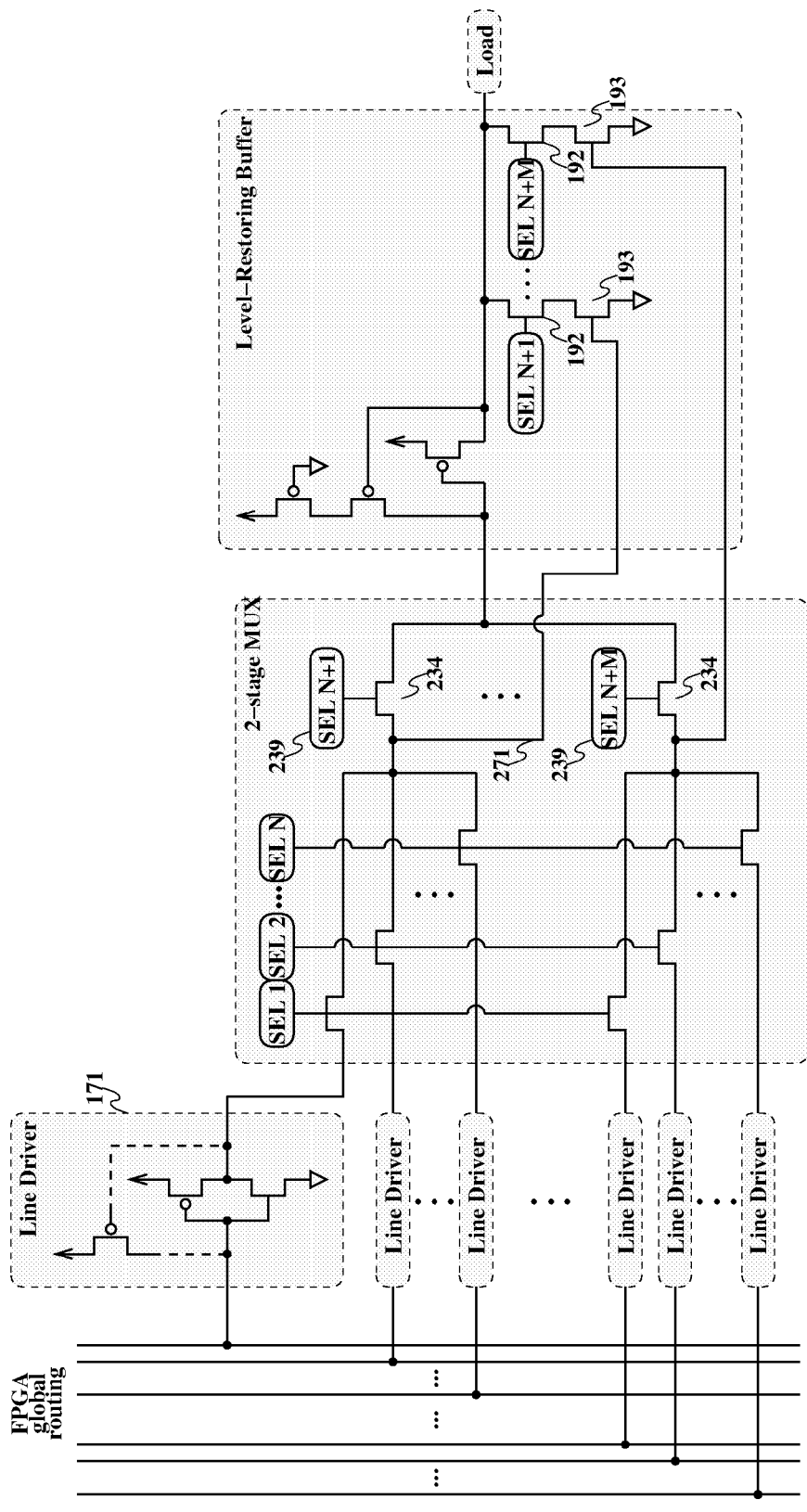
Fig. 30: Improved programmable interconnect structure with an unfolded two-stage multiplexer with connections from middle nodes, an inverting pMOS transistor, a keeper, and a bleeder (SEL stands for Selection; MC stands for Memory Cell).

LEVEL-RESTORING BUFFERS FOR PROGRAMMABLE INTERCONNECT CIRCUITS AND METHOD FOR BUILDING THE SAME

FIELD OF THE INVENTION

The present invention relates generally to interconnect structures, and to methods for reducing interconnect structure signal propagation delays or power consumption. More specifically, the invention relates to efficient implementation of programmable interconnect structures such as those provided within a Field-Programmable Gate Array (FPGA).

BACKGROUND OF THE INVENTION

Programmable Logic Devices (PLDs) are a well-known type of digital integrated circuit that can be programmed to perform specified logic functions. One type of PLDs, the Field-Programmable Gate Array (FPGA), generally includes an array of programmable Look-Up Tables (LUTs) interconnected by a programmable interconnect structure. The LUTs and the interconnect are typically programmed by loading a stream of configuration bits into internal configuration memory cells that define how the LUTs and the interconnects are configured. The collective states of the individual memory cells determine the function of the FPGA.

The programmable interconnect structure typically includes a large number of interconnect lines of various lengths interconnected by programmable switches. These switches are controlled by select lines that originate from configuration memory cells. Thus, the values stored in the configuration memory cells determine the "routing," i.e., the electrical connections between various points in the FPGA. Switches can also be used to select a signal from one of several interconnect lines and to pass the selected signal to a LUT, or to select one of several output signals from a LUT to pass to an interconnect line.

An interconnect structure can be implemented in various ways. For example, a set of switches (11) can implement a multiplexer structure that selects one of several interconnect lines (12) and drives a signal on the selected interconnect line onto a destination interconnect line (13). One such set of switches is shown in FIG. 1.

A standard way to implement a switch is by the use of a cMOS transmission gate (21), as shown in FIG. 2. It is well known that the use of full transmission gate comprised of paired nMOS transistor (22) and pMOS transistor (23), with the pMOS transistor being driven by the complementary signal (24), provides good performance in terms of static power consumption. However, this solution doubles the size of the multiplexer by doubling the number of pass transistors, increases the parasitic capacitance, and thus degrades the timing performance. In addition, both the true signal (25) and complementary signal (24) must be provided to the paired transistors, which further increases the die area. Large buffers must also be provided to handle the increased load of driving both the nMOS and pMOS transistors.

One solution to this problem is to use single pass-transistor switches, (31). Since the switching speed of an nMOS pass transistor is superior to that of an pMOS pass transistor, programmable routing and logic in FPGAs are typically implemented using nMOS pass transistors, as shown in FIG. 3(a). Since the threshold voltage drop, $V_T$, across an nMOS device degrades the high logic value, also referred to as Strong '1', to a lower voltage level referred to as Weak '1', causing the pMOS transistor (32) of the downstream buffer (33) to not turn fully off, this approach suffers from static power consumption and reduced noise margins, as shown in FIG. 3(b).

The timing performance of FPGA's is mainly limited by the delay of the programmable interconnect network. The presence of the parasitics resistance and capacitance along the wire, and the on resistance and the parasitic capacitances of the MOS pass transistor degrades the signal waveform as it propagates along the interconnect. The propagation delay is a byproduct of the degradation of the signal, as shown in FIGS. 4 and 5. The rise time (51) and fall time (52) of the midpoint signal are slow compared to the input signal. Power consumption is also a byproduct of the degradation of the signal. As shown in FIGS. 6 and 7, the dynamic power consumption increases with increasing signal degradation.

It is well known that the propagation delay increases quadratically with the number of series switches (as described, for example, in J. M. Rabaey, A. Chandrakasan, and B. Nikolić, "Digital Integrated Circuits: A Design Perspective," 2nd edition, Prentice-Hall, 2003). On the other side, the delay through a chain of buffers grows linearly with the number of such devices. The equivalent delay point is typically three or four series connections. The classical approach to reduce the dependence of delay on the number of pass transistors and the wire length from quadratic to linear is the insertion of buffers and repeaters. In FIG. 3(a), an inverting buffer (33) is provided at the common node of a multiplexer. However, there is a large static power consumption that should be taken care of. A so called level-restoring buffer aims to reduce this static power consumption.

FIG. 8 illustrates one well-known implementation of the level-restoring buffer. The standard pMOS transistor pull-up (81), called a keeper, in an active feedback of an inverter (82) reduces the static power consumption, but degrades the signal propagation delay and/or active power consumption. Also a well-known implementation of the level-restoring buffer is with a keeper (91) and a bleeder (92) is illustrated in FIG. 9.

Another possible solution to the threshold voltage drop problem is to drive the gates of the nMOS pass transistors with a voltage level VGG higher than VDD. In this case, the voltage level after passing a high value VDD through the nMOS pass transistor is the gate voltage VGG minus the nMOS threshold voltage VT, or VGG-VT. VGG is upperly bounded by the maximum voltage that can safely be applied to the gate of an nMOS transistor without damaging the transistor gate oxide.

Using low-threshold or zero-threshold pass transistors eliminates most of the threshold drop, and thus avoids the static power dissipation in the downstream buffer. Since the subthreshold leakage current increases exponentially as the threshold voltage is reduced, sneak DC-current paths can be formed between line drivers of different output logic levels, and isolated by off low-threshold or zero-threshold pass transistors, as described in J. M. Rabaey, A. Chandrakasan, and B. Nikolić, "Digital Integrated Circuits: A Design Perspective," 2nd edition, Prentice-Hall, 2003. In addition, combining devices of different threshold on a single chip requires additional steps during device fabrication, which makes the solution more expensive and also technology dependent.

The cascode voltage switch logic family, which is presented in FIG. 11, can also be used for level restoring, but it requires differential signaling. The inverted signal can be routed to the level-restoring buffer through a dedicated interconnect, but this adds a considerable area overhead in an FPGA where the interconnect is the dominant area component. The inverted signal can also be generated locally by a low-voltage inverter as shown in FIG. 12, but this requires a second power supply.

Another technique is to compare the input low-voltage signal to a reference signal using a differential amplifier configuration. The drawback of this method is the constant non-zero tail current required to bias the differential amplifier into the active region. Thus, the static current from the receiver blocks in the entire array will be unacceptable.

The level-restoring buffer shown in FIG. 13 has been proposed in R. Puri, L. Stok, J. Cohn, D. Kung, D. Pan, D. Sylvester, and A. Srivastava, "Pushing ASIC performance in a power envelope," Proceedings of the 40th Annual Design Automation Conference, pages 788-793, Annaheim, Calif., June 2003. Since the first inverter is connected to the supply voltage through a parallel compound nMOS-pMOS that never has a zero series resistance, it suffers from increased delay against, for example, the cascode load based buffer. In addition, due to the diode-connected nMOS on the supply path, the drive strength of the first inverter is very sensitive to nMOS parameters variations and supply bounce, and leads to a large delay spread of the circuit.

The pass-transistor half latch shown in FIG. 14 also uses a dual voltage supply. The pass-transistor gate is driven from the lower voltage supply to accommodate low-swing signaling. It has been reported that this circuit is able to reduce the power consumption. The costs of such approach is the need for an additional voltage supply.

Therefore, it is desirable to provide alternative structures for implementing level-restoring buffers for programmable interconnect circuits that improves the propagation delay and power consumption at a minimum cost. It is further desirable to provide multiplexers having the same characteristics that can be used for any purpose in other integrated circuits.

BRIEF DESCRIPTION OF THE DRAWINGS

The subsequent detailed description of the preferred embodiments section makes reference to the accompanying drawings, in which:

FIG. 1 shows a programmable interconnect structure that implements a routing scheme for 8:1 multiplexing using a set of eight switches.

FIG. 2 illustrates a detailed schematic of an interconnect structure that implements an 8:1 multiplexer with full transmission gates and an output inverting buffer.

FIG. 3(a) illustrates a detailed schematic of an interconnect structure that implements an 8:1 multiplexer with nMOS pass transistors and an output inverting buffer.

FIG. 3(b) illustrates the static power degradation of the 8:1 multiplexer with nMOS pass transistors and an output inverting buffer presented in FIG. 3(a).

FIG. 4 shows a perfect time diagram.

FIG. 5 shows a real time diagram.

FIG. 6 shows a large slope edge leading to a small dynamic power consumption.

FIG. 7 shows a small slope edge leading to a large dynamic power consumption.

FIG. 8 illustrates the standard level-restoring buffer with a keeper only.

FIG. 9 illustrates the standard level-restoring buffer with a keeper and a bleeder.

FIG. 10 illustrates an 8:1 multiplexer with nMOS pass transistors and a standard level-restoring buffer.

FIG. 11 shows a level-restoring buffer based on cascode voltage switch logic family.

FIG. 12 shows a level-restoring buffer based on cascode voltage switch logic family with low-voltage inverter.

FIG. 13 shows another level-restoring buffer.

FIG. 14 shows the "pass transistor half-latch" level-restoring buffer.

FIG. 15 shows one stage of an FPGA Look-Up Table.

FIG. 16 shows a 2-stage multiplexers.

FIG. 17 shows a typical programmable interconnect structure with a 1-stage multiplexers.

FIG. 18 shows a typical programmable interconnect structure with a 2-stage multiplexers.

FIG. 19 shows an improved programmable interconnect structure with a one-stage multiplexer, an inverting buffer, and a keeper according to one embodiment of this present invention.

FIG. 20 shows an improved programmable interconnect structure with a one-stage multiplexer, an inverting pMOS transistor, and a keeper according to another embodiment of this present invention.

FIG. 21 shows an improved programmable interconnect structure with a one-stage multiplexer, an inverting buffer, a keeper, and a bleeder according to one embodiment of this present invention.

FIG. 22 shows an improved programmable interconnect structure with a one-stage multiplexer, an inverting pMOS transistor, a keeper, and a bleeder according to another embodiment of this present invention.

FIG. 23 shows an improved programmable interconnect structure with a two-stage multiplexer with connections from input nodes, an inverting buffer, and a keeper according to yet another embodiment of this present invention.

FIG. 24 shows an improved programmable interconnect structure with a two-stage multiplexer with connections from input nodes, an inverting pMOS transistor, and a keeper according to yet another embodiment of this present invention.

FIG. 25 shows an improved programmable interconnect structure with a two-stage multiplexer with connections from input nodes, an inverting buffer, a keeper, and a bleeder according to yet another embodiment of this present invention.

FIG. 26 shows an improved programmable interconnect structure with a two-stage multiplexer with connections from input nodes, an inverting pMOS transistor, a keeper, and a bleeder according to yet another embodiment of this present invention.

FIG. 27 shows an improved programmable interconnect structure with a two-stage multiplexer with connections from middle nodes, an inverting buffer, and a keeper according to yet another embodiment of this present invention.

FIG. 28 shows an improved programmable interconnect structure with a two-stage multiplexer with connections from middle nodes, an inverting pMOS transistor, and a keeper according to yet another embodiment of this present invention.

FIG. 29 shows an improved programmable interconnect structure with an unfolded two-stage multiplexer with connections from middle nodes, an inverting buffer, a keeper, and a bleeder according to yet another embodiment of this present invention.

FIG. 30 shows an improved programmable interconnect structure with an unfolded two-stage multiplexer with connections from middle nodes, an inverting pMOS transistor, a keeper, and a bleeder according to yet another embodiment of this present invention.

DETAILED DESCRIPTION OF THE INVENTION

Specific embodiments of the invention will now be described in detail with references to the accompanying figures. Like elements in the various figures are denoted by like reference numerals throughout the figures for consistency.

In the following detailed description of the invention, numerous specific details are set forth in order to provide a more thorough understanding of the invention. However, it will be apparent to one of ordinary skill in the art that the invention may be practiced without these specific details. In order instances, well-known features have not been described in detail to avoid obscuring the invention.

FIG. 19 shows a level-restoring buffer implementation that has an additional multiplexor unfolded at the output of the inverter (198). The multiplexor is comprised of a number of pull-down devices, where each of these pull-down devices is comprised of a series connection of two nMOS pass transistors; one will be referred to as the activation transistor (192) and the other as the commitment transistor (193). Each activation transistor (192) has its gate connected to one of the select lines (197), which also drives the gate of a pass transistor (194) in the multiplexor before the level-restoring buffer (199). Therefore, each select line drives the gate of both a pass transistor in the one-stage multiplexer (194) and an activation transistor after the inverter (192). Each commitment transistor (193) has its gate driven by the line at the input to a pass transistor (196) in the one-stage multiplexer (199). The described structure provides an improvement in propagation delay and/or power consumption over the circuit from prior art shown in FIG. 17. The signal selected from the one-stage multiplexer (199) will have a degraded logic-1 value due to the well known threshold drop through a nMOS pass transistor (194). This degradation in the signal causes a large propagation delay at the output of the buffer when passing a logic-1 value from the line-driver (171) to the level-restoring buffer (172). The novel level-restoring buffer (1910) with the described pull-down elements speed up this transition by discharging the output node of the inverting element (198) faster and helping directly drive this node to logic-0 before the inverter is able to react. Power consumption is improved, as the improved response at the output node turns on the keeper (191) faster, which reduces leakage power consumption.

FIG. 20 shows a level-restoring buffer implementation that has a similar structure as described above, only the inverter (198) has been replaced with a single pMOS element (201). This configuration will yield a faster transition when the pMOS element is active, due to the reduced capacitance at the output node of the inverter.

FIG. 21 shows a level-restoring buffer implementation that has a similar structure as described above, only the keeper (191) has been replaced with a series connection of a keeper (191) and a bleeder (211), to weaken the effect of the keeper. Since the line driver (171) fights a weaker keeper, the speed of the transition is improved.

FIG. 22 shows a level-restoring buffer implementation that has a similar structure as described above, only the keeper (191) has been replaced with a series connection of a keeper (191) and a bleeder (211), to weaken the effect of the keeper. Since the line driver (171) fights a weaker keeper, the speed of the transition is improved. Also, the inverter (198) has been replaced with a single pMOS element (201). This configuration will yield a faster transition when the pMOS element is active, due to the reduced capacitance at the output node of the inverter.

FIG. 23 has a similar structure to that shown in FIG. 19, with a few changes. The one-stage multiplexer (199) has been replaced with a two-stage multiplexer (231). This requires two pass transistors in series to be active in order for a signal to pass from the line driver (171) to the output node of the inverter (198). Due to the series pass transistors in the two-stage multiplexer, two series activation pass transistors are required (232, 233). The primary activation pass transistors (232) have their gates driven by select lines (239) from the second stage of the multiplexer, which also drives the gates of second stage pass transistors (234). The secondary activation pass transistors (233) have their gates driven by select lines (2310) from the first stage of the multiplexer, which also drives the gates of first stage pass transistors (235). The commitment pass transistors (238) have their gates driven by the inputs of the first stage pass transistors (237). The benefits of the improved level-restoring buffer (composed of the addition pull-down elements) are the same as those listed in the discussion of FIG. 19.

FIG. 24 is similar to that contained in the discussion of FIG. 20, except the discussion can be applied to the circuit described in FIG. 23.

FIG. 25 is similar to that contained in the discussion of FIG. 21, except the discussion can be applied to the circuit described in FIG. 23.

FIG. 26 is similar to that contained in the discussion of FIG. 26, except the discussion can be applied to the circuit described in FIG. 23.

FIG. 27 has a similar structure to that of FIG. 23. However, the same pull-down circuit structure of FIG. 23 is employed with a single activation pass transistor (192) and a commitment pass transistor (193) in each pull-down circuit. Each activation pass transistor has its gate driven by a second stage select line (239), which also drives a second stage pass transistor (234). Each commitment pass transistor has its gate driven by the input to a second stage pass transistor (271). The benefits of the improved level-restoring buffer (composed of the addition pull-down elements) are the same as those listed in the discussion of FIG. 19.

FIG. 28 is similar to that contained in the discussion of FIG. 20, except the discussion can be applied to the circuit described in FIG. 27.

FIG. 29 is similar to that contained in the discussion of FIG. 21, except the discussion can be applied to the circuit described in FIG. 27.

FIG. 30 is similar to that contained in the discussion of FIG. 26, except the discussion can be applied to the circuit described in FIG. 27.

What is claimed is:

1. A programmable interconnect circuit, the circuit including a plurality of input nodes, an output node, and a plurality of select lines, wherein one of the input nodes is coupled to the output node in response to signals placed on the select lines, the circuit comprising:
   a) a power supply line and a ground line; and
   b) a common internal node; and
   c) a plurality of selection nMOS pass transistors, with each of said selection nMOS pass transistors being connected between one of said input nodes and said common internal node, and each said selection nMOS pass transistor having the control electrode connected to one of said select lines; and
   d) a buffer device composed of an inverter, with said inverter having its input connected to said common internal node, its output connected to said output node, its power terminal connected to said power supply line, and its ground terminal connected to said ground line; and e) a pull-up device coupled between said power supply line and said common internal node, with said pull-up device being comprised of a pMOS transistor that has its control electrode connected to said output node; and f) a plurality of pull-down devices, with each of said pull-down devices being connected between said output node and said ground line, each of said pull-down devices being comprised of a series connection of an activation nMOS pass transistor and a commitment nMOS pass transistor; and g) a plurality of activation connections, such that there is an activation connection between the control electrode of each of said activation nMOS pass transistors and one of said select lines; and h) a plurality of commitment connections, such that there is a commitment connection between the control electrode of each of said commitment nMOS pass transistors and one of said input nodes, such that an individual instance of said input nodes and an individual instance of said selection lines which are both connected to one particular instance of said selection nMOS pass transistors are also both connected to one particular instance of said pull-down devices;

whereby each of said pull-down devices augments one of said selection nMOS pass transistors to improve propagation delay and/or power consumption.

2. The structure of claim 1, where one of said buffer devices is comprised of an inverting pMOS transistor, with one of said inverting pMOS transistors being coupled between said power supply line and said output node, the control electrode of said inverting pMOS transistor being connected to said common internal node.

3. The structure of claim 1, where said pull-up device is comprised of a series connection of two pMOS transistors, with the control electrode of one pMOS transistor being connected to said output node, and the control electrode of the other pMOS transistor being connected to said ground line.

4. The structure of claim 3, where one of said buffer devices is comprised of an inverting pMOS transistor, with one of said inverting pMOS transistors being coupled between said power supply line and said output node, the control electrode of said inverting pMOS transistor being connected to said common internal node.

5. A programmable interconnect circuit, the circuit including a plurality of input nodes, an output node, a plurality of select lines, wherein one of the input nodes is coupled to the output node in response to signals placed on two stages of select lines, such that there are first-stage select lines and second-stage select lines, the circuit comprising:

a) a power supply line and a ground line; and
b) a plurality of first-stage internal nodes; and
c) a common internal node; and
d) a plurality of first-stage selection nMOS pass transistors, with each of said first-stage selection nMOS pass transistors being connected between one of said input nodes and one of said first-stage internal nodes, and each said first-stage selection nMOS pass transistors having its control electrode connected to one of said first-stage select lines; and
e) a plurality of second-stage selection nMOS pass transistors, with each of said second-stage selection nMOS pass transistors being connected between a plurality of said first-stage internal nodes and said common internal node, and each said second-stage selection nMOS pass transistor having the control electrode connected to one of said second-stage select lines; and f) a buffer device composed of an inverter, with said inverter having its input connected to said common internal node, its output connected to said output node, its power terminal connected to said power supply line, and its ground terminal connected to said ground line; and g) a pull-up device coupled between said power supply line and said common internal node, with said pull-up device being comprised of a pMOS transistor that has its control electrode connected to said output node; and h) a plurality of pull-down devices, with each of said pull-down devices being connected between said output node and said ground line, each of said pull-down devices being comprised of a series connection of a first-stage activation nMOS pass transistor, a second-stage activation nMOS pass transistor, and a commitment nMOS pass transistor; and i) a plurality of first-stage activation connections, such that there is a first-stage activation connection between the control electrode of each of said first-stage activation nMOS pass transistors and one of said first-stage select lines; and j) a plurality of second-stage activation connections, such that there is a second-stage activation connection between the control electrode of each of said second-stage activation nMOS pass transistors and one of said second-stage select lines; and k) a plurality of commitment connections, such that there is a commitment connection between the control electrode of each of said commitment nMOS pass transistors and one of said input nodes, such that an individual instance of said input nodes and an individual instance of said first-stage selection lines which are both connected to one particular instance of said first-stage selection nMOS pass transistors are also both connected to one particular instance of said pull-down devices;

whereby each of said pull-down devices augments one of said first-stage selection nMOS pass transistors to improve propagation delay and/or power consumption.

6. The structure of claim 5, where one of said buffer devices is comprised of an inverting pMOS transistor, with one of said inverting pMOS transistors being coupled between said power supply line and said output node, the control electrode of said inverting pMOS transistor being connected to said common internal node.

7. The structure of claim 5, where said pull-up device is comprised of a series connection of two pMOS transistors, with the control electrode of one pMOS transistor being connected to said output node, and the control electrode of the other pMOS transistor being connected to said ground line.

8. The structure of claim 7, where one of said buffer devices is comprised of an inverting pMOS transistor, with one of said inverting pMOS transistors being coupled between said power supply line and said output node, the control electrode of said inverting pMOS transistor being connected to said common internal node.

9. A programmable interconnect circuit, the circuit including a plurality of input nodes, an output node, a plurality of select lines, wherein one of the input nodes is coupled to the output node in response to signals placed on two stages of select lines, such that there are first-stage select lines and second-stage select lines, the circuit comprising:

a) a power supply line and a ground line; and
b) a plurality of first-stage internal nodes; and
c) a common internal node; and d) a plurality of first-stage selection nMOS pass transistors, with each of said first-stage selection nMOS pass transistors being connected between one of said input nodes and one of said first-stage internal nodes, and each said first-stage selection nMOS pass transistors having its control electrode connected to one of said first-stage select lines; and e) a plurality of second-stage selection nMOS pass transistors, with each of said second-stage selection nMOS pass transistors being connected between a plurality of said first-stage internal nodes and said common internal node, and each said second-stage selection nMOS pass transistor having the control electrode connected to one of said second-stage select lines; and f) a buffer device composed of an inverter, with said inverter having its input connected to said common internal node, its output connected to said output node, its power terminal connected to said power supply line, and its ground terminal connected to said ground line; and g) a pull-up device coupled between said power supply line and said common internal node, with said pull-up device being comprised of a pMOS transistor that has its control electrode connected to said output node; and h) a plurality of pull-down devices, with each of said pull-down devices being connected between said output node and said ground line, each of said pull-down devices being comprised of a series connection of an activation nMOS pass transistor and a commitment nMOS pass transistor; and i) a plurality of activation connections, such that there is an activation connection between the control electrode of each of said activation nMOS pass transistors and one of said second-stage select lines; and j) a plurality of commitment connections, such that there is a commitment connection between the control electrode of each of said commitment nMOS pass transistors and one of said first-stage internal nodes, such that an individual instance of said first-stage internal nodes and an individual instance of said second-stage selection lines which are both connected to one particular instance of said second-stage selection nMOS pass transistors are also both connected to one particular instance of said pull-down devices;

whereby each of said pull-down devices augments one of said second-stage selection nMOS pass transistors to improve propagation delay and/or power consumption.

10. The structure of claim 9, where one of said buffer devices is comprised of an inverting pMOS transistor, with one of said inverting pMOS transistors being coupled between said power supply line and said output node, the control electrode of said inverting pMOS transistor being connected to said common internal node.

11. The structure of claim 9, where said pull-up device is comprised of a series connection of two pMOS transistors, with the control electrode of one pMOS transistor being connected to said output node, and the control electrode of the other pMOS transistor being connected to said ground line.

12. The structure of claim 11, where one of said buffer devices is comprised of an inverting pMOS transistor, with one of said inverting pMOS transistors being coupled between said power supply line and said output node, the control electrode of said inverting pMOS transistor being connected to said common internal node.

* * * * *